(12) United States Patent
Nakamura et al.

(10) Patent No.: US 11,108,985 B2
(45) Date of Patent: Aug. 31, 2021

(54) IMAGING DEVICE, IMAGING SYSTEM, AND MOVABLE OBJECT

(71) Applicant: CANON KABUSHIKI KAISHA, Tokyo (JP)

(72) Inventors: Kohichi Nakamura, Kawasaki (JP); Masahiro Kobayashi, Tokyo (JP); Hideo Kobayashi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/268,269

(22) Filed: Feb. 5, 2019

(65) Prior Publication Data
US 2019/0253653 A1    Aug. 15, 2019

(30) Foreign Application Priority Data
Feb. 9, 2018   (JP) .............................. JP2018-022404

(51) Int. Cl.
*H04N 5/378*   (2011.01)
*H04N 5/369*   (2011.01)
*H04N 5/376*   (2011.01)

(52) U.S. Cl.
CPC ........... *H04N 5/379* (2018.08); *H04N 5/3765* (2013.01)

(58) Field of Classification Search
CPC ............................. H04N 5/378; H04N 5/379
USPC .................. 348/294; 250/208.1; 341/169
See application file for complete search history.

(56) References Cited

U.S. PATENT DOCUMENTS

| | | | | |
|---|---|---|---|---|
| 6,140,877 A | * | 10/2000 | Forbes ................ | H03F 3/45479 330/258 |
| 2014/0078367 A1 | | 3/2014 | Sonoda | |
| 2016/0301891 A1 | * | 10/2016 | Kim .................... | H04N 5/37455 |
| 2017/0272678 A1 | * | 9/2017 | Sakakibara ............ | H04N 5/378 |
| 2017/0289470 A1 | * | 10/2017 | Deng ................... | H04N 5/3765 |
| 2017/0339362 A1 | * | 11/2017 | Koyama ................ | H04N 5/374 |
| 2017/0347050 A1 | | 11/2017 | Sakakibara | |
| 2018/0013412 A1 | | 1/2018 | Kikuchi et al. | |
| 2020/0014872 A1 | * | 1/2020 | Kawazu ............ | H01L 27/14612 |

FOREIGN PATENT DOCUMENTS

| | | |
|---|---|---|
| JP | 2014-60573 A | 4/2014 |
| WO | 2016/009832 A1 | 1/2016 |
| WO | 16/104174 A1 | 6/2016 |
| WO | 16/136448 A1 | 9/2016 |

* cited by examiner

*Primary Examiner* — Anthony J Daniels
(74) *Attorney, Agent, or Firm* — Canon U.S.A., Inc. IP Division

(57) ABSTRACT

Provided is an imaging device including: a photoelectric converter; an AD converter unit including a differential stage; and a ramp signal generator. The photoelectric converter and a first part of the differential stage are arranged in a first chip, a second part of the differential stage is arranged in a second chip that is a different chip from the first chip and stacked on the first chip, and the ramp signal generator is arranged in a different chip from the first chip.

21 Claims, 28 Drawing Sheets

FRONT VIEW

TOP VIEW

BACK VIEW

IMAGING DEVICE, IMAGING SYSTEM, AND MOVABLE OBJECT

BACKGROUND OF THE INVENTION

Field of the Invention

One disclosed aspect of the embodiments relates to an imaging device, an imaging system, and a movable object.

Description of the Related Art

An imaging device having a photoelectric converter and an analog-to-digital (AD) converter that performs AD conversion on a signal from the photoelectric converter is known.

As one example of such an imaging device, International Publication No. WO2016/009832 discloses an example in which an AD converter has a differential stage having two input nodes and a current mirror circuit. A ramp signal is input to one of the input nodes of the differential stage, and a signal from a photoelectric converter is input to the other input node. The disclosed example is a stacked type imaging device in which the other input node is provided in a first chip on which a photoelectric converter is formed, the one input node is provided in a second chip, and the first chip and the second chip are stacked. That is, in the disclosed imaging device, two input nodes of a differential stage of an AD converter unit are divided and arranged into two chips.

SUMMARY OF THE INVENTION

One aspect of the embodiments provides an arrangement or placement of a ramp signal generator when a first part of the differential stage of the AD converter unit is provided in the first chip and a second part of the differential stage is provided in the second chip.

One aspect of the embodiments has been made in view of the problem described above, and one aspect is an imaging device including a photoelectric converter; an AD converter unit including a differential stage and a ramp signal generator. The photoelectric converter and a first part of the differential stage are arranged in a first chip, a second part of the differential stage is arranged in a second chip different from the first chip and stacked on the first chip, and the ramp signal generator is arranged in a different chip from the first chip.

Further features of the disclosure will become apparent from the following description of exemplary embodiments with reference to the attached drawings.

DESCRIPTION OF THE EMBODIMENTS

Each embodiment will be described below with reference to the drawings.

First Embodiment

Figure 1:
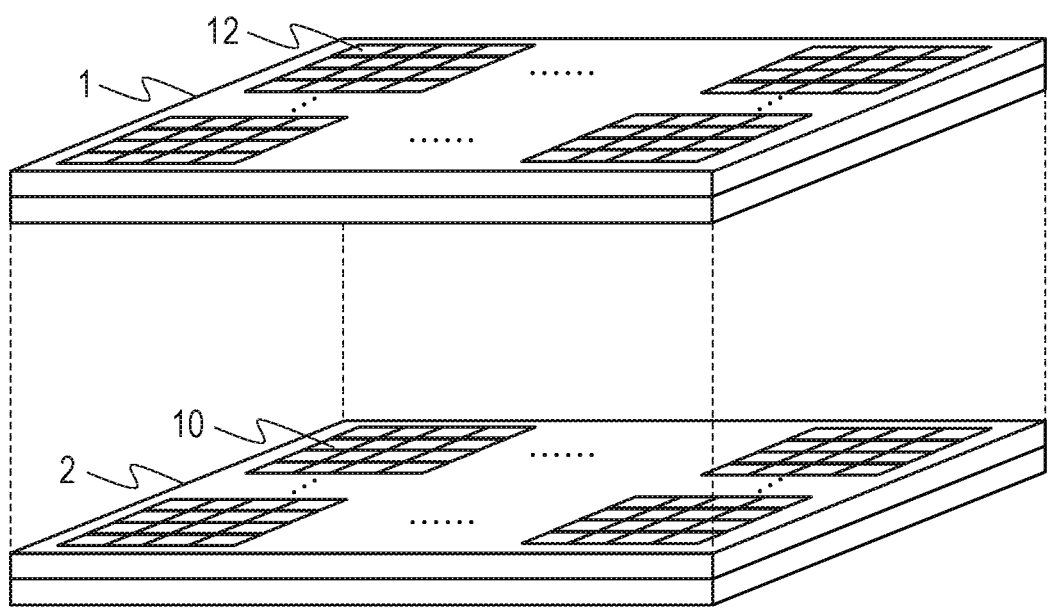
FIG. 1 is a schematic diagram of an imaging device.

FIG. 1 is a diagram illustrating a first chip 1 and a second chip 2 included in an imaging device of the present embodiment. In the first chip 1, pixels 12 are arranged over a plurality of rows and the plurality of columns. Further, in the second chip 2, signal processing circuits 10 are arranged over a plurality of rows and the plurality of columns. Note that, while only the pixels 12 and the signal processing circuits 10 are depicted here, in addition to those components, control lines used for controlling the pixels 12 and signal lines used for transmitting signals output from the pixels 12 are arranged as appropriate in the first chip 1 and the second chip 2. Further, drive circuits such as a vertical scanning circuit, a timing generator, and the like are arranged as appropriate in the first chip 1 or the second chip 2.

Figure 2:
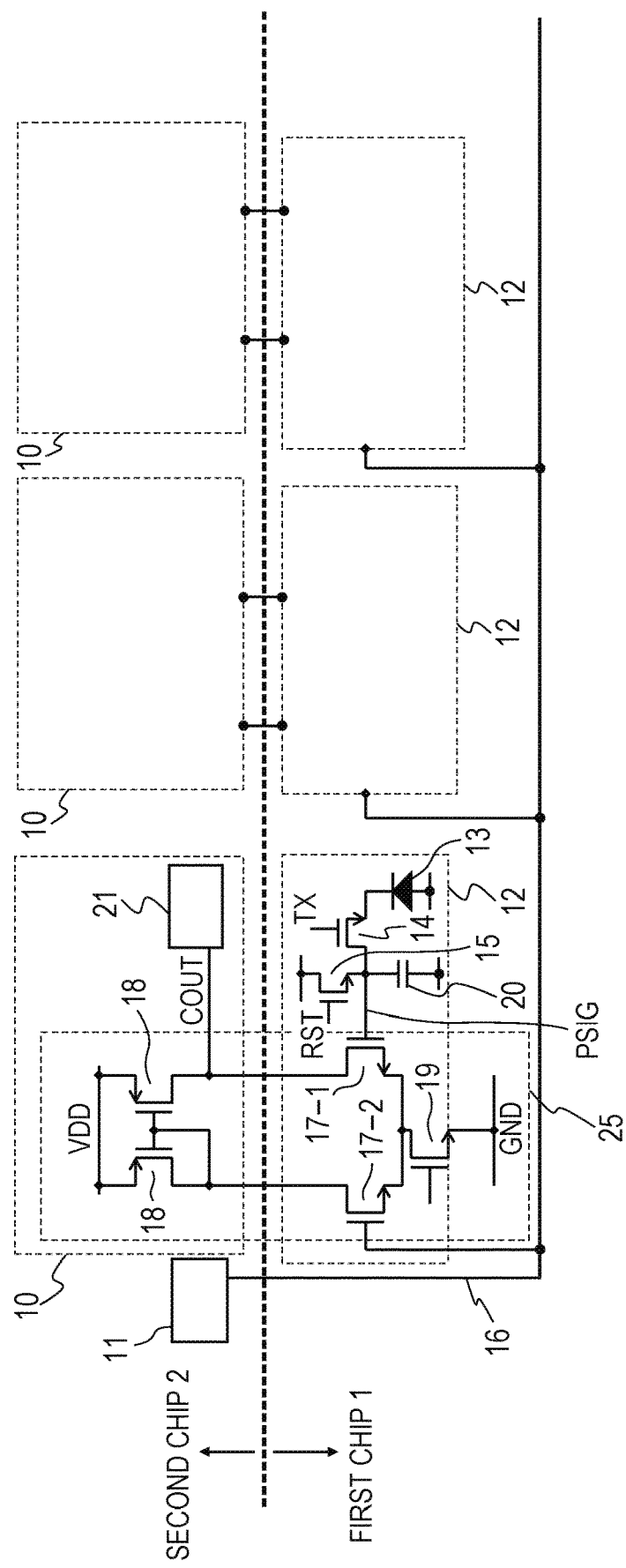
FIG. 2 is a circuit diagram of the imaging device.

FIG. 2 is a circuit diagram illustrating a circuit of the imaging device of the present embodiment.

Pixels 12 each including the photoelectric converter (photodiode) 13, a transfer transistor 14, a reset transistor 15, and a floating diffusion 20 are arranged in the first chip 1. The pixels 12 are arranged over a plurality of rows and a plurality of columns as illustrated in FIG. 1.

Further, each of the pixels 12 includes input transistors 17-1 and 17-2 and a current source 19.

Transistor group 18 forming a current mirror circuit, memory units 21, and a ramp signal generator 11 are arranged in the second chip 2.

A power supply voltage VDD is supplied to a common node of each transistor group 18. Further, the input transistors 17-1 and 17-2 are connected to one of the primary nodes of the current source 19. The power supply voltage GND (ground potential) is supplied to the other primary node of the current source 19.

The input transistors 17-1 and 17-2, the transistor group 18 forming the current mirror circuit, and the current source 19 form a differential stage 25. The input transistors 17-1 and 17-2 form a differential pair. The input transistors 17-1 and 17-2 are provided as a plurality of input nodes of the differential stage 25. The gate, which is a control node, of the input transistor 17-1 of the differential stage 25 is connected to the floating diffusion 20. Further, since the input transistor 17-1 is connected to the photoelectric converter 13 via the transfer transistor 14, it can be said that the input transistor 17-1 is an input node of the differential stage 25 that is connected to the photoelectric converter 13.

Further, since the gate, which is a control node, of the input transistor 17-2 is connected to the ramp signal generator 11 via a transmission line 16, it can be said that the input transistor 17-2 is an input node of the differential stage 25 that is connected to the ramp signal generator 11.

The input transistors 17-1 and 17-2 and the current source 19 that are a first part of the differential stage 25 are arranged in the first chip 1 in which the photoelectric converter 13 is arranged. On the other hand, the transistor group 18 forming the current mirror circuit that is a second part of the differential stage 25 is arranged in the second chip 2. Further, in the present embodiment, the ramp signal generator 11 is arranged in the second chip 2, which is the different chip from the first chip 1 in which the input transistors 17-1 and 17-2, the current source 19 that are the first part of the differential stage 25, and the photoelectric converter 13 are arranged.

The differential stage 25 is a comparator that outputs a comparison result signal COUT indicating a result of comparison between the potential of the control node of the input transistor 17-1 and the potential of the control node of the input transistor 17-2. That is, the comparator including the differential stage 25 and the memory unit 21 correspond to an (analog to digital) AD converter unit that converts an analog signal based on charges accumulated by the photoelectric converter 13 into a digital signal.

Figure 3:
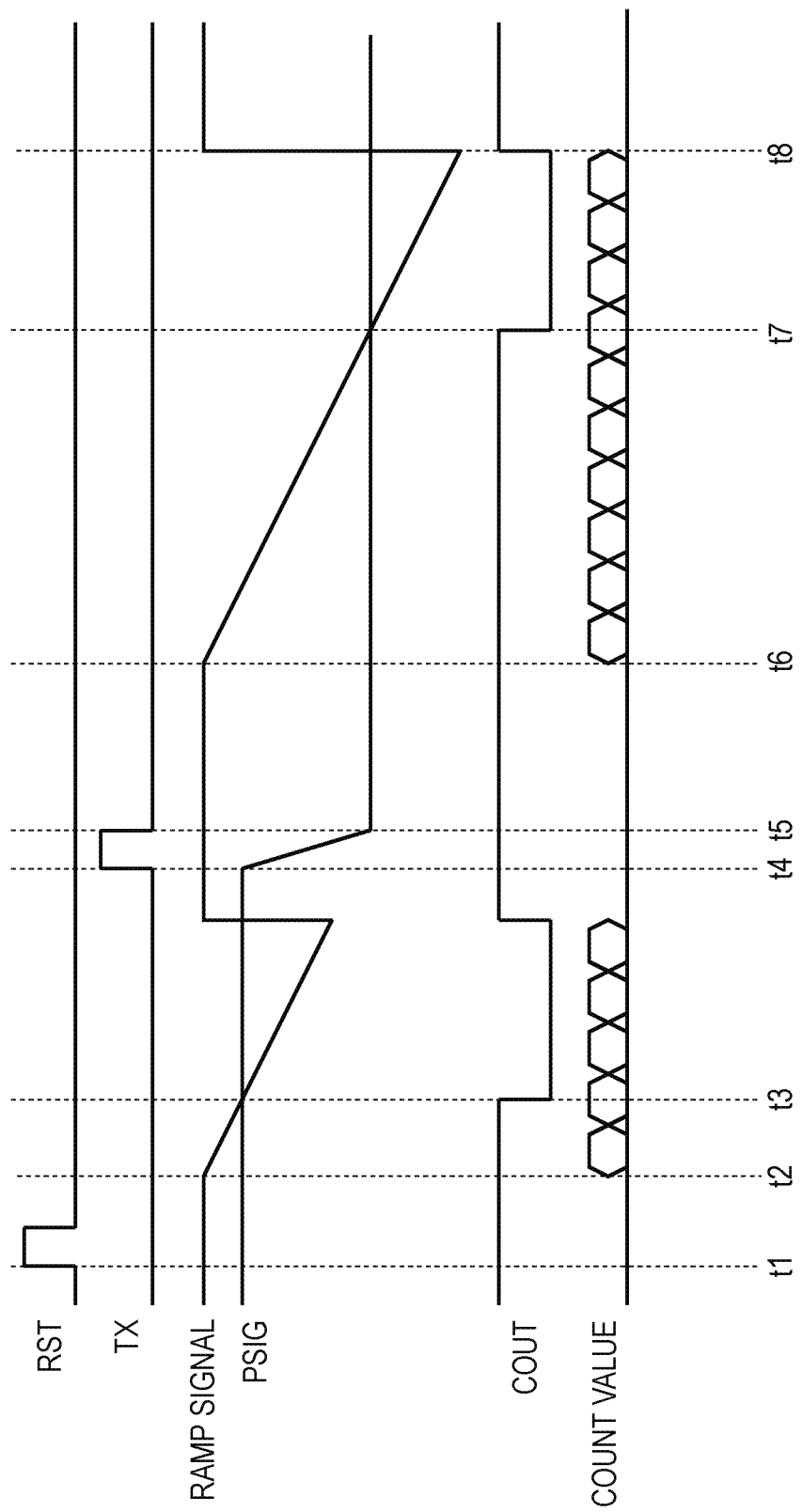
FIG. 3 is a diagram illustrating an operation of the imaging device.

FIG. 3 is a diagram illustrating an operation of the imaging device illustrated in FIG. 2. Each signal illustrated in FIG. 3 corresponds to each signal illustrated in FIG. 2.

At time t1, the vertical scanning circuit (not illustrated) sets a signal RST to a High level and then sets to a Low level. The width of the pulse RST is sufficient to activate its function. Thereby, reset and release of the reset of the potential of the floating diffusion 20 are performed. The potential of the control node of the input transistor 17-1 is the potential resulted when the reset of the floating diffusion 20 is released.

AD conversion based on the potential of the floating diffusion 20 where the reset is released is then performed. This is AD conversion of a noise signal.

At time t2, the ramp signal generator 11 monotonically changes the potential of the ramp signal with time. The monotonic change as used herein means that the direction of a change of the potential is maintained in the same direction from the start to the end of the change. Even when the change rate of the potential of the ramp signal changes from the start to the end of the change, this is within the scope of a monotonic change of the potential.

Further, a count signal by which pulses of a clock signal are counted is input to the memory unit 21 from a counter circuit (not illustrated). The counter circuit starts counting the clock signal in response to the start of a change of the potential of the ramp signal supplied by the ramp signal generator 11.

At time t3, the relationship between the potentials of the input transistors 17-1 and 17-2 is inverted. In response, the signal level of the signal COUT changes. In response to the change of the signal level of the comparison result signal COUT, the memory unit 21 latches the count signal. Thereby, a digital signal based on the potential of the floating diffusion 20 is held in the memory unit 21. This count signal held by the memory unit 21 is a digitized signal of a noise signal based on the potential of the floating diffusion 20. This digital signal is denoted as noise data.

Then, after ending the change of the potential of the ramp signal, the ramp signal generator 11 resets the ramp signal to a predetermined potential.

At time t4, the vertical scanning circuit sets the signal TX to a High level and then sets to a Low level. Thereby, charges accumulated in the photoelectric converter 13 are transferred to the floating diffusion 20.

At time t6, the ramp signal generator 11 monotonically changes the potential of the ramp signal with time.

At time t7, the relationship between the potentials of the input transistors 17-1 and 17-2 is inverted. In response, the signal level of the signal COUT changes. In response to the change of the signal level of the comparison result signal COUT, the memory unit 21 latches the count signal. Thereby, a digital signal based on the potential of the floating diffusion 20 is held in the memory unit 21. This count signal held by the memory unit 21 is a digitized signal of a light signal based on the potential of the floating diffusion 20. Such a digital signal is denoted as light data.

A scanning circuit (not illustrated) then reads, from the memory unit 21 corresponding to each pixel 12, out light data and noise data held by each memory unit 21.

The differential stage 25 compares the potential of the ramp signal output by the ramp signal generator 11 with the potential of the floating diffusion 20 to which charges generated by the photoelectric converter 13 are transferred via the transfer transistor 14. After the change of the potential of the ramp signal is started, the signal level of the comparison result signal COUT changes in response to inversion of the relationship between the potential of the ramp signal and the potential of the floating diffusion 20.

The comparison result signal COUT is output to the memory unit 21. A count signal in which clock signals are counted is input to the memory unit 21 from the counter circuit (not illustrated). The counter circuit starts counting of pulses of a clock signal in response to the start of the change of the potential of the ramp signal supplied by the ramp signal generator 11. The memory unit 21 latches a count signal in response to the change of the signal level of the comparison result signal COUT. Thereby, a digital signal based on the potential of the floating diffusion 20 is held in the memory unit 21.

Figure 4:
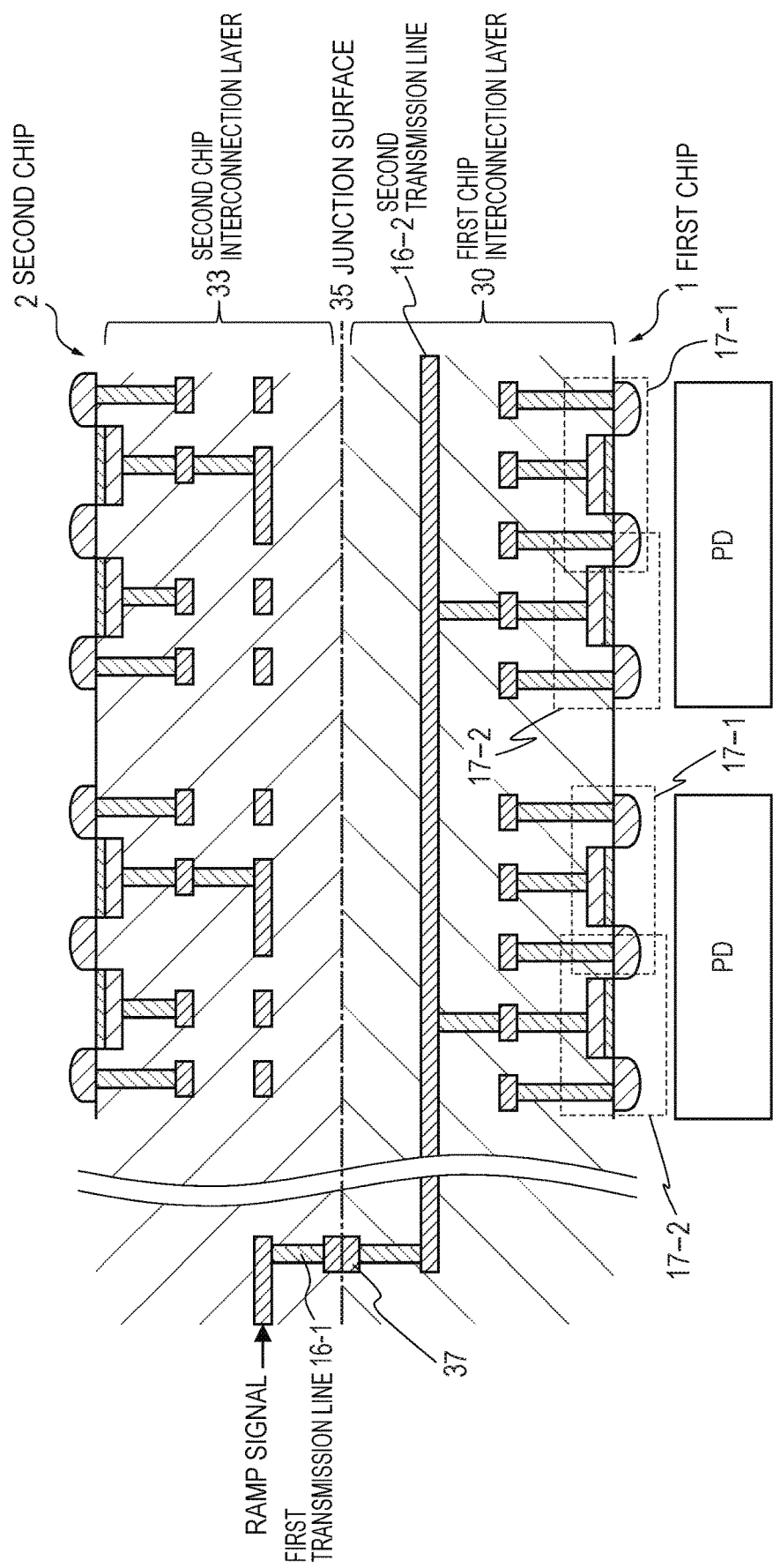
FIG. 4 is a cross-sectional view of the imaging device.

FIG. 4 is a cross-sectional view of the imaging device illustrated in FIG. 2. In FIG. 4, the same components as those illustrated in FIG. 2 are labeled with the same references as those of FIG. 2.

The first chip 1 and the second chip 2 are connected by a junction surface 35. The connection part 37 connects a first transmission line 16-1 and a second transmission line 16-2 to each other that transmit the ramp signal. The transmission line 16 illustrated in FIG. 2 has the first transmission line 16-1 and the second transmission lint 16-2. The connection part 37 directly connects a first chip interconnection layer 30, which is an interconnection layer of the first chip 1, to a second chip interconnection layer 33, which is an interconnection layer of the second chip 2, by using a metal. Typically, Cu, Al, Au, or W can be used as the metal. The second transmission line 16-2 is connected to the input transistor 17-2 of the plurality of differential stages 25. In other words, the input transistor 17-2 of each of the plurality of differential stages 25 is connected to one connection part 37. That is, the single connection part 37 is shared by respective input transistors 17-2 of the multiple differential stages 25.

In the present embodiment, as illustrated in FIG. 2, the ramp signal generator 11 is arranged in the second chip 2, which is a different chip from the first chip 1 in which the input transistors 17-1 and 17-2, and the current source 19 that are a first part of the differential stage 25, and the photoelectric converter 13 are arranged. The ramp signal generator 11 that generates a ramp signal may be a source of various noises such as switching noise, random noise, or the like. It is therefore preferable to increase the distance between the ramp signal generator 11 and an analog circuit in which a reduction in the signal-to-noise (S/N) ratio due to noise is likely to occur compared to a digital circuit. Accordingly, in the present embodiment, to increase the distance between the pixel 12 in which a reduction in the S/N ratio due to noise is likely to occur and the ramp signal generator 11, the ramp signal generator 11 is arranged in the chip different from the first chip 1 in which the pixel 12 is arranged. Thereby, the pixel 12 is less likely to be affected by the noise generated by the ramp signal generator 11.

Thereby, the imaging device of the present embodiment has an advantage of being capable of obtaining a signal in which influence of the noise due to the ramp signal generator 11 is suppressed.

Further, the transistor included in the ramp signal generator 11 is silicidized for a fast operation. Typically, a metal semiconductor compound made of nickel and silicon or cobalt and silicon is formed for silicidization. On the other hand, the pixel 12 included in the first chip 1 is not silicidized in order to suppress metal diffusion to the photoelectric converter 13. It is therefore preferable to form the chip which is silicidized and the chip which is not silicidized separately. It is therefore preferable to form the ramp signal generator 11, which is silicidized, in a chip other than the first chip 1 that is not silicidized.

The memory unit 21 is similarly silicidized for a fast operation. Thus, it is possible to form the memory unit 21 and the ramp signal generator 11 in the same second chip 2 and perform silicidization thereon together.

Second Embodiment

The present embodiment will be described mainly for the features different from those of the first embodiment.

In the imaging device of the first embodiment, the transmission line 16 that transmits the ramp signal is connected to the input transistors 17-2 of the plurality of differential stages 25 by the single connection part 37. In the imaging device of the present embodiment, a single connection part 37 corresponds to a single differential stage 25.

Figure 5:
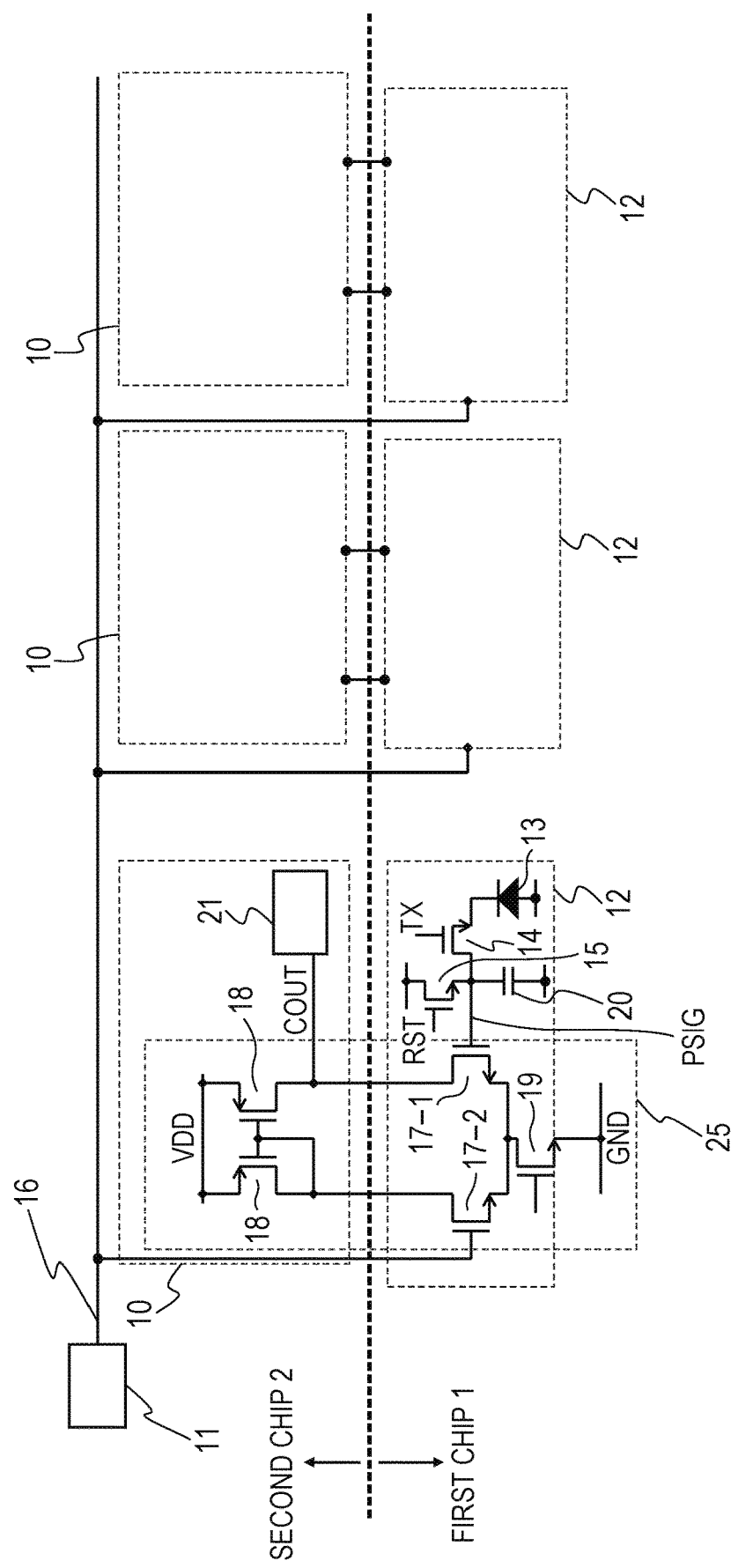
FIG. 5 is a circuit diagram of an imaging device.

FIG. 5 is a circuit diagram of the imaging device of the present embodiment.

In the first embodiment, the transmission line 16 is arranged for, or connected to, the plurality of differential stages 25 in the first chip 1. On the other hand, in the present embodiment, the transmission line 16 is arranged for, or connected to, the plurality of differential stages 25 in the second chip 2.

Figure 6:
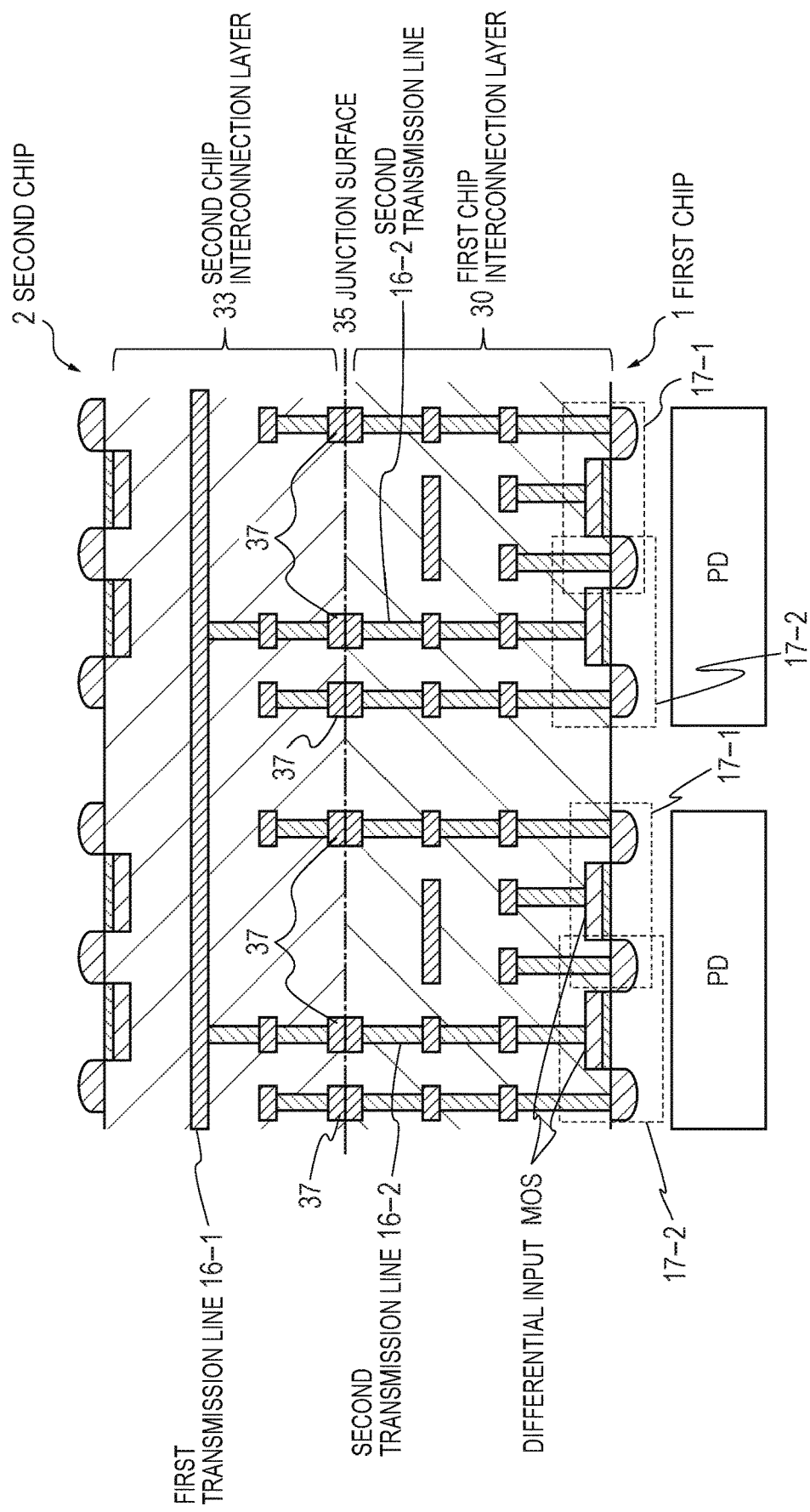
FIG. 6 is a cross-sectional view of the imaging device.

FIG. 6 is a cross-sectional view of the imaging device illustrated in FIG. 5. In FIG. 6, the same components as those illustrated in FIG. 5 are labeled with the same references as those of FIG. 5. As described also for FIG. 5, in the imaging device of the present embodiment, the first transmission line 16-1 that transmits a ramp signal is arranged for the plurality of differential stages 25. Further, the first transmission line 16-1 is connected to the second transmission line 16-2 via the connection part 37. Each connection part 37 is connected to the first transmission line 16-1 and the input transistor 17-2 of each differential stage 25.

In the present embodiment, the number of the connection parts 37 per unit area is larger than in the configuration of FIG. 4 of the first embodiment. On the other hand, since the interconnection layer of the first chip 1 is reduced, an advantage of improved flexibility in design of the first chip 1 is obtained.

Third Embodiment

An imaging device of the present embodiment will be described mainly for the features different from those of the first embodiment.

The imaging device of the present embodiment is different from that of the first embodiment in that a buffer circuit that relays a ramp signal is provided on the transmission line 16 of the first chip 1.

Figure 7:
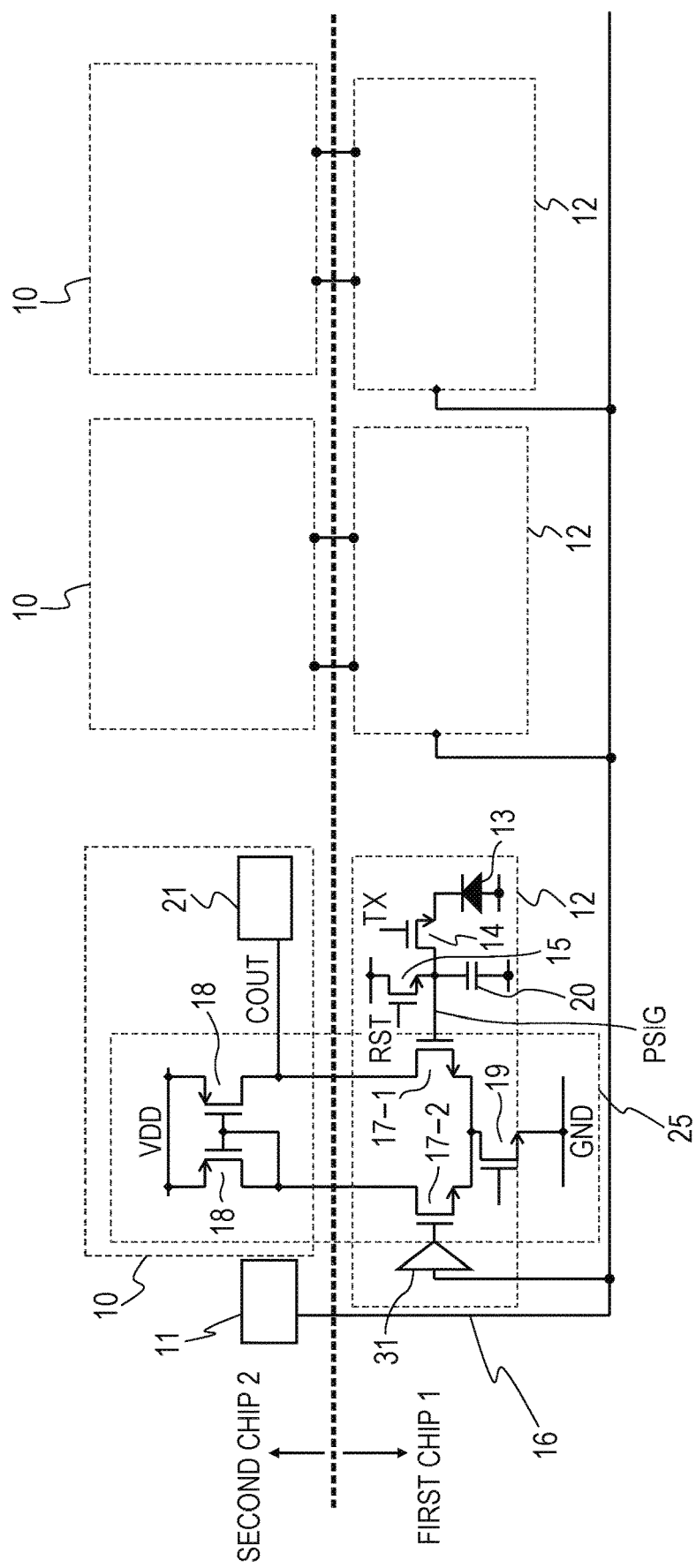
FIG. 7 is a circuit diagram of an imaging device.

FIG. 7 is a circuit diagram of the imaging device of the present embodiment. In FIG. 7, the same components as those illustrated in FIG. 2 are labeled with the same references as those of FIG. 2.

In the present embodiment, a buffer circuit 31 that relays a signal transmitted by the transmission line 16 is provided in the first chip 1. With the buffer circuit 31 being provided, the drive load of the ramp signal generator 11 is reduced compared to the imaging device of the first embodiment. This can improve the signal accuracy of the ramp signal.

Figure 8:
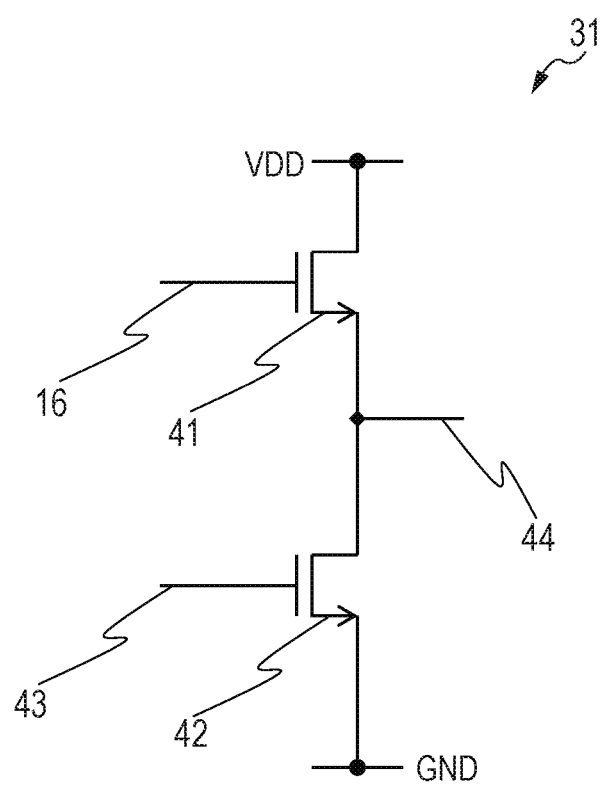
FIG. 8 is a circuit diagram of a buffer circuit.

FIG. 8 illustrates a circuit of the buffer circuit 31. The buffer circuit 31 includes transistors 41 and 42 that are n-channel MOS transistors. The transmission line 16 is connected to the gate of the transistor 41. The power supply voltage VDD is supplied to one of the primary nodes of the transistor 41, and the transistor 42 is connected to the other primary node. A predetermined voltage is input to the gate 43 of the transistor 42, and the power supply voltage GND is supplied to the other primary node. The node connected to respective primary nodes of the transistor 41 and the transistor 42 is connected to a wiring 44. The wiring 44 is connected to the gate of the input transistor 17-2.

The buffer circuit 31 of the present embodiment is preferably formed of a transistor having the same conductivity type as the input transistor 17-2. This is because, in a case of the buffer circuit 31 including a transistor of a different conductivity type from the input transistor 17-2, a plurality of wells are formed in the first chip 1 for forming transistors of different conductivity types, which will be an obstacle for reduction in size of the first chip 1, and it is thus preferable that the buffer circuit 31 provided near the input transistor 17-2 have the same conductivity type as the input transistor 17-2. Furthermore, it is preferable that all the transistors provided in the first chip 1 have the same conductivity type as that of the transistors of the pixel 12. Thereby, since the number of wells can be reduced for a case where transistors of different conductivity types are provided, reduction in size of the first chip 1 can be facilitated.

Fourth Embodiment

An imaging device of the present embodiment will be described mainly for the features different from those of the third embodiment.

In the imaging device of the third embodiment, the buffer circuit that relays the ramp signal is provided in the first chip 1. In the imaging device of the present embodiment, a buffer circuit that relays the ramp signal is provided in the second chip 2.

Figure 9:
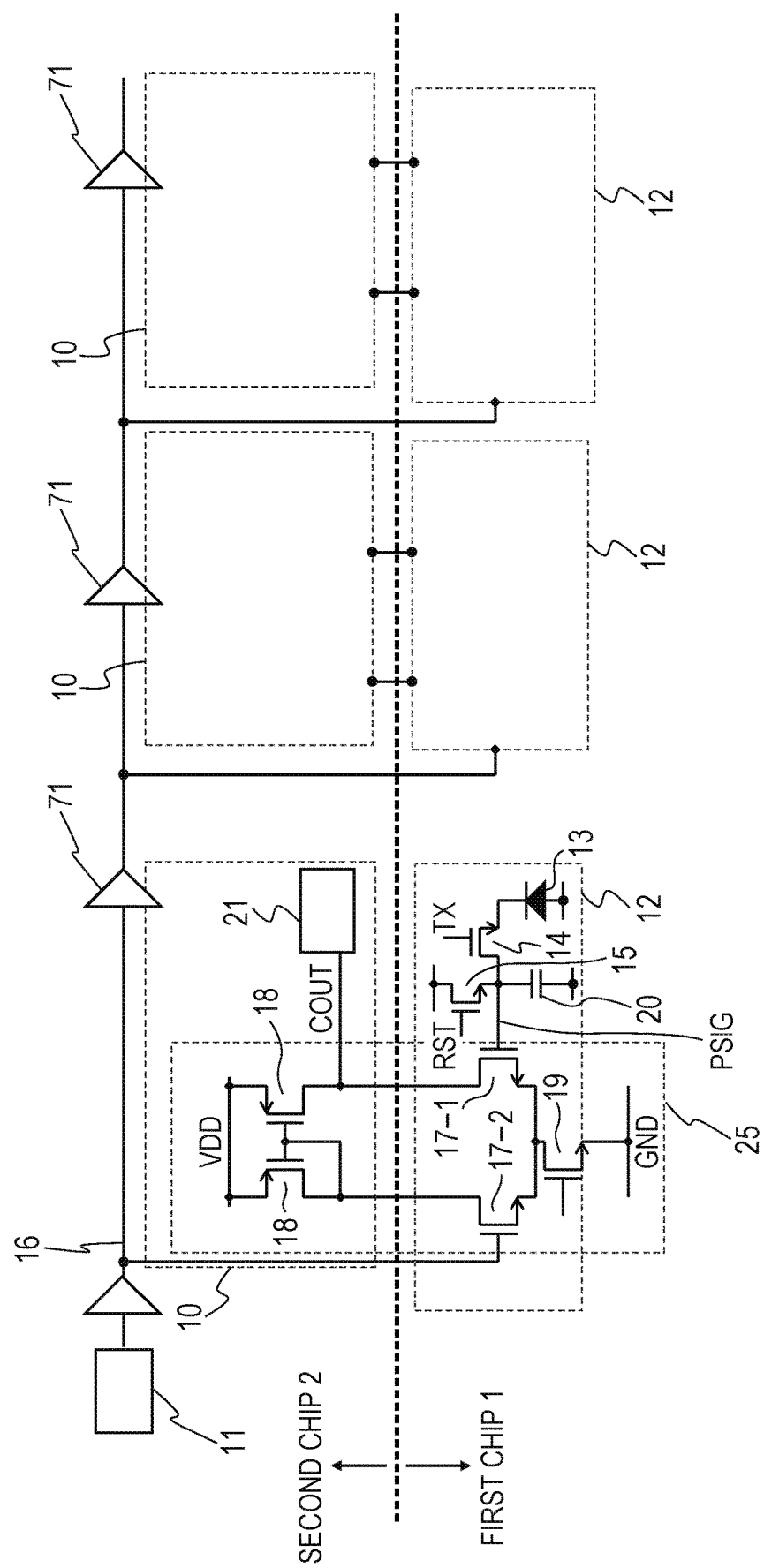
FIG. 9 is a circuit diagram of an imaging device.

FIG. 9 is a circuit diagram of the imaging device of the present embodiment. In the present embodiment, the transmission line 16 is arranged for, or connected to, the plurality of differential stages 25 in the second chip 2 in a similar manner to FIG. 5 and FIG. 6.

In the imaging device of the present embodiment, a plurality of buffer circuits 71 are connected in series.

Since the buffer circuit 71 of the present embodiment is arranged in the second chip 2, the number of wells in the first chip 1 does not increase even when a transistor whose conductivity type is different from that of the input transistor 17-2 and the transistor included in the pixel 12 are provided. Further, the transistor group 18 includes p-channel MOS transistors. Therefore, when the transistor of the buffer circuit 71 and the transistor group 18 are arranged close to each other, a p-channel MOS transistor is used for the transistor of the buffer circuit 71. Thereby, a well can be shared by the transistor group 18 and the buffer circuit 71, and the second chip 2 can be reduced in size. It is therefore preferable that the buffer circuit 71 of the present embodiment be configured to have a transistor whose conductivity type is different from that of the input transistor 17-2 and is the same as that of the transistor group 18.

Figure 10:
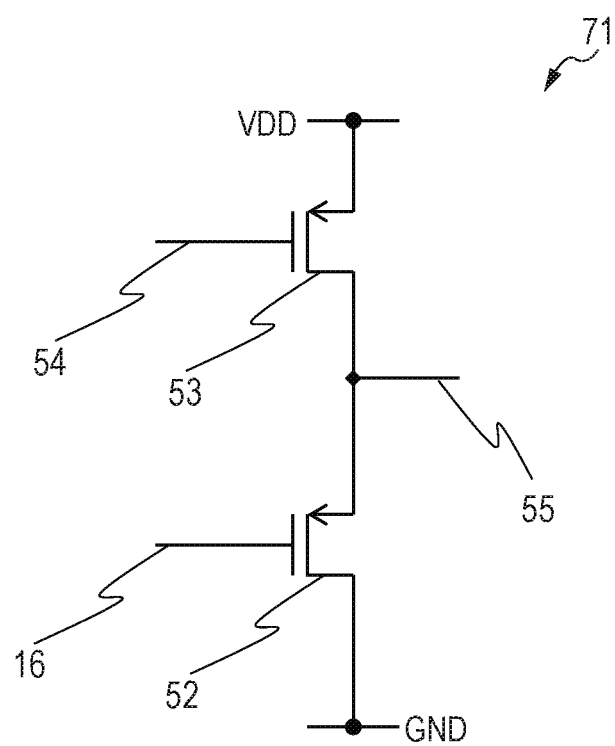
FIG. 10 is a circuit diagram of a buffer circuit.

FIG. 10 is a circuit diagram illustrating a circuit of the buffer circuit 71, which includes p-channel transistors 52 and 53 of different conductivity type from that of transistors 41 and 42 of the buffer circuit 31 of FIG. 8. The transmission line 16 is connected to the gate of the transistor 52. The power supply voltage GND is supplied to the one of the primary nodes of the transistor 52, and the transistor 53 is connected to the other primary node. A predetermined voltage is input to the gate 54 of the transistor 53, and the power supply voltage VDD is supplied to the other primary node. A node connected to respective primary nodes of the transistor 52 and the transistor 53 is connected to a wiring 55. The wiring 55 is connected to the gate of the input transistor 17-2 via the connection part 37.

As described above, the imaging device of the present embodiment has an advantage of suppressing a buffer circuit from being an obstacle for reduction in size of the first chip 1 and the second ship 2 even with a configuration having the buffer circuit that relays the ramp signal.

Fifth Embodiment

An imaging device of the present embodiment will be described mainly for the features different from those of the fourth embodiment.

In the imaging device of the fourth embodiment, the buffer circuits that relay the ramp signal are provided in series. The imaging device of the present embodiment is an example in which buffer circuits are provided in parallel to the transmission lines 16.

Figure 11:
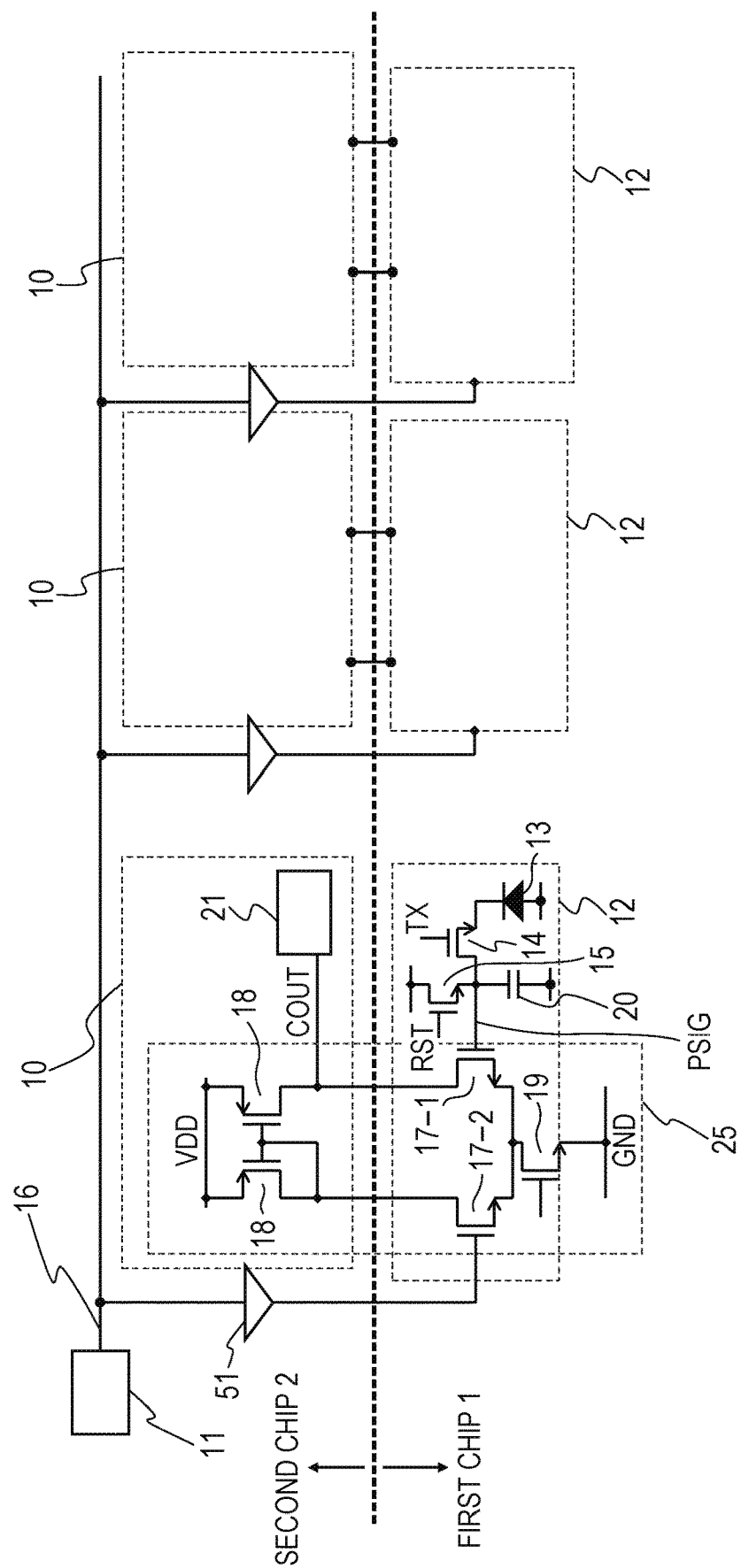
FIG. 11 is a circuit diagram of an imaging device.

FIG. 11 is a circuit diagram of the imaging device of the present embodiment. A plurality of buffer circuits 51 are provided in parallel to the transmission lines 16. Further, in other words, an input node of one buffer circuit 51 is connected to the ramp signal generator 11 in the configuration of FIG. 9. In the present embodiment, input nodes of a plurality of buffer circuits 51 are connected to the ramp signal generator 11.

In the configuration of FIG. 9, since the buffer circuits 71 are arranged in series, noise due to respective buffer circuits 51 is accumulated, and therefore noise is increased as the number of the buffer circuits 51 that relay the ramp signal increases. Further, delays due to the buffer circuits 71 are accumulated, and thus delay of the ramp signal is increased. In contrast, since the plurality of buffer circuits 51 are connected in parallel to the transmission line 16 in the imaging device of the present embodiment, delay of the ramp signal is smaller than that of the configuration of FIG. 9. Thus, in the present embodiment, delay of the ramp signal between the differential stage 25 having the shortest wiring length from the ramp signal generator 11 and the differential stage 25 having the longest wiring length from the ramp signal generator 11 can be reduced compared to the configuration of FIG. 9.

Further, in the imaging device of the present embodiment, the buffer circuit 51 is provided in the second chip 2. As described in the fourth embodiment, since the buffer circuit 51 is arranged in the second chip 2, the number of wells in the first chip 1 does not increase even with a configuration having a transistor whose conductivity type is different from that of the input transistor 17-2 and the transistor included in the pixel 12. Further, the transistor group 18 includes p-channel MOS transistors. Therefore, when the transistor of the buffer circuit 51 and the transistor group 18 are arranged close to each other, a p-channel MOS transistor is used for the transistor of the buffer circuit 51. Thereby, a well can be shared by the transistor group 18 and the buffer circuit 51, and the second chip 2 can be reduced in size. It is therefore preferable that the buffer circuit 51 of the present embodiment be configured to have a transistor whose conductivity type is different from that of the input transistor 17-2 and is the same as that of the transistor group 18.

As described above, the imaging device of the present embodiment has an advantage of suppressing a buffer circuit from being an obstacle for reduction in size of the first chip 1 and the second ship 2 even with a configuration having the buffer circuit that relays the ramp signal.

Sixth Embodiment

An imaging device of the present embodiment will be described mainly for the features different from those of the first embodiment.

Figure 12:
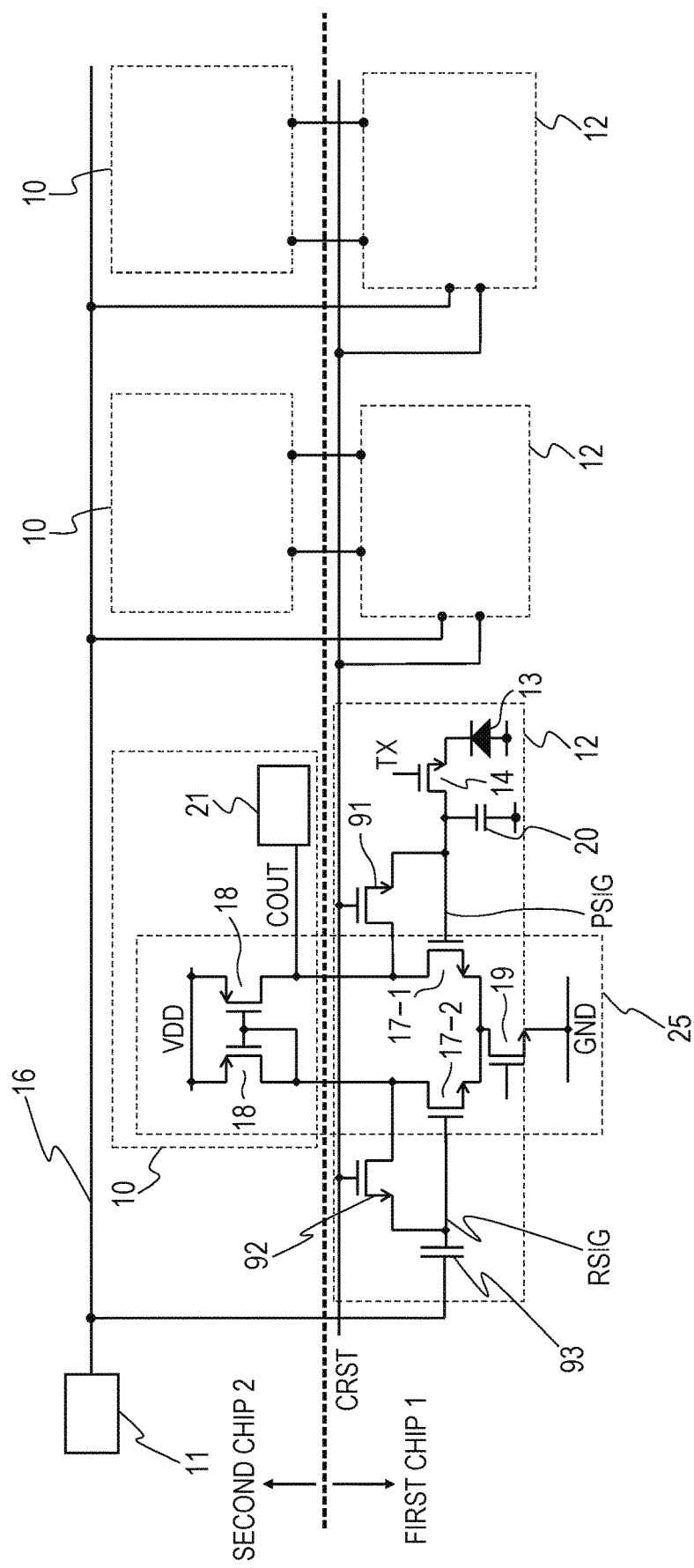
FIG. 12 is a circuit diagram of an imaging device.

FIG. 12 is a circuit diagram of the imaging device of the present embodiment.

In the imaging device of the present embodiment, a capacitor 93 is provided between the transmission line 16 and the input transistor 17-2.

The ramp signal generator 11 is connected to one of the primary nodes of the capacitor 93, and the other primary node is connected to one of the primary nodes of a transistor 92.

The signal CRST is supplied to the control node of the transistor 92 from the vertical scanning circuit (not illustrated). The differential stage 25 is connected to the other primary node of the transistor 92. Specifically, the other primary node of the transistor 92 is connected to a node to which the input transistor 17-2 and the transistor group 18 are connected.

The potential of the control node of the input transistor 17-2 is denoted as a signal RSIG.

One of the primary nodes of a transistor 91 is connected to the floating diffusion 20, and the other primary node is connected to the differential stage 25. Specifically, the other primary node of the transistor 91 is connected to a node to which the input transistor 17-1 and the transistor group 18 are connected. The signal CRST is input to the control node of the transistor 91 and the control node of the transistor 92.

Figure 13:
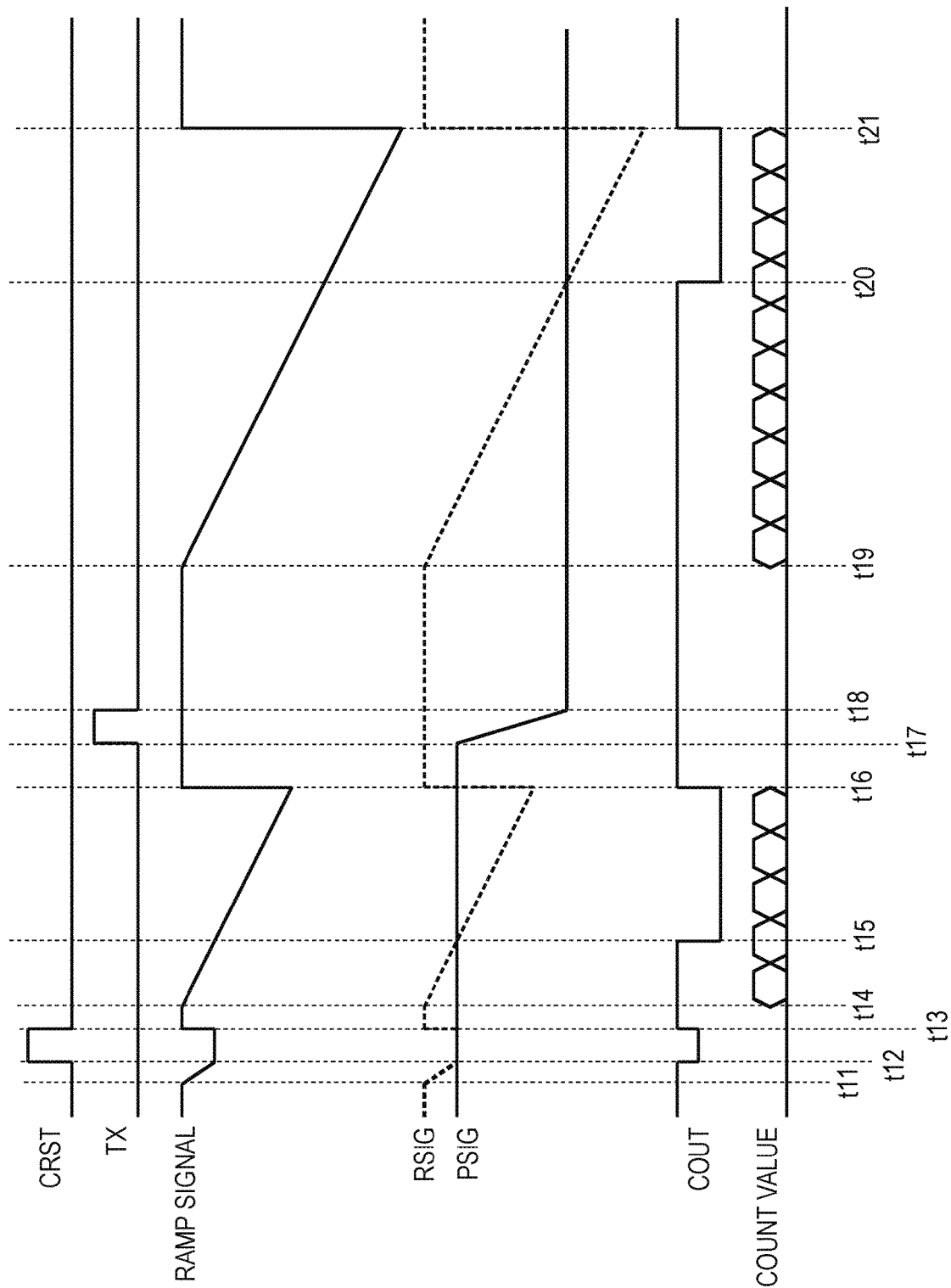
FIG. 13 is a diagram illustrating an operation of the imaging device.

FIG. 13 is a timing diagram illustrating the operation of the imaging device illustrated in FIG. 12.

At time t11, the ramp signal generator 11 changes the potential of the ramp signal to a potential used for resetting the differential stage 25.

At time t12, the vertical scanning circuit (not illustrated) sets the signal CRST to a High level and then sets the signal CRST to a Low level at time t13. Thereby, the capacitor 93 clamps the potential difference between the potential of the transmission line 16 (output of the ramp signal generator 11) obtained at time t13 and the signal RSIG.

The ramp signal generator 11 then changes the potential of the ramp signal to a ramp start potential.

At time t14, the ramp signal generator 11 starts monotonically changing the potential of the ramp signal.

At time t15, the relationship between the signal RSIG and the signal PSIG is inverted. In response, the signal level of the signal COUT changes, and the memory unit 21 latches the count signal. The signal latched by the memory unit 21 corresponds to noise data.

At time t16, the ramp signal generator 11 completes the change of the potential of the ramp signal and resets the potential of the ramp signal to the ramp start potential.

The subsequent operation of obtaining S-data is the same as the operation described with reference to FIG. 3.

In the present embodiment, the transistor 91 and the transistor 92 are provided in the first chip 1. A parasitic capacitance (inter-wire and/or coupling capacitance) between the transistor 91 and the floating diffusion 20 substantially increases the capacitance of the floating diffusion 20. Thus, it is possible to improve the sensitivity of the imaging device by reducing the parasitic capacitance. Therefore, the wiring length is longer when the transistor 91 is provided in the second chip 2 than when the transistor 91 is provided in the first chip 1. Further, since the transistor 91 and the floating diffusion 20 are connected via the connection part 37, the parasitic capacitance due to the connection part 37 also increases. It is therefore preferable to provide the transistor 91 in the first chip 1 in terms of reduction of the parasitic capacitance.

Further, it is preferable that the control node of the transistor 92 and the control node of the transistor 91 be connected to a common signal line. The transistors 91 and 92 have the same operation timing. It is preferable that the control nodes of the transistors 91 and 92 are connected via a common signal line in terms of reduction in the wiring area and synchronization of operations of the transistors 91 and 92.

The capacitor 93 can be provided in any of the first chip 1 and the second chip 2 in accordance with design. When reduction in size of the pixel 12 is demanded, the capacitor 93 is preferably provided in the second chip 2.

As discussed above, the imaging device of the present embodiment can provide a high-sensitivity stack-type imaging device that suppresses increase in the capacitance of the floating diffusion 20 even when the capacitor 93 for clamping and the transistors 91 and 92 are provided.

Seventh Embodiment

An example of the ramp signal generator 11 will be described in the present embodiment.

Figure 14A:
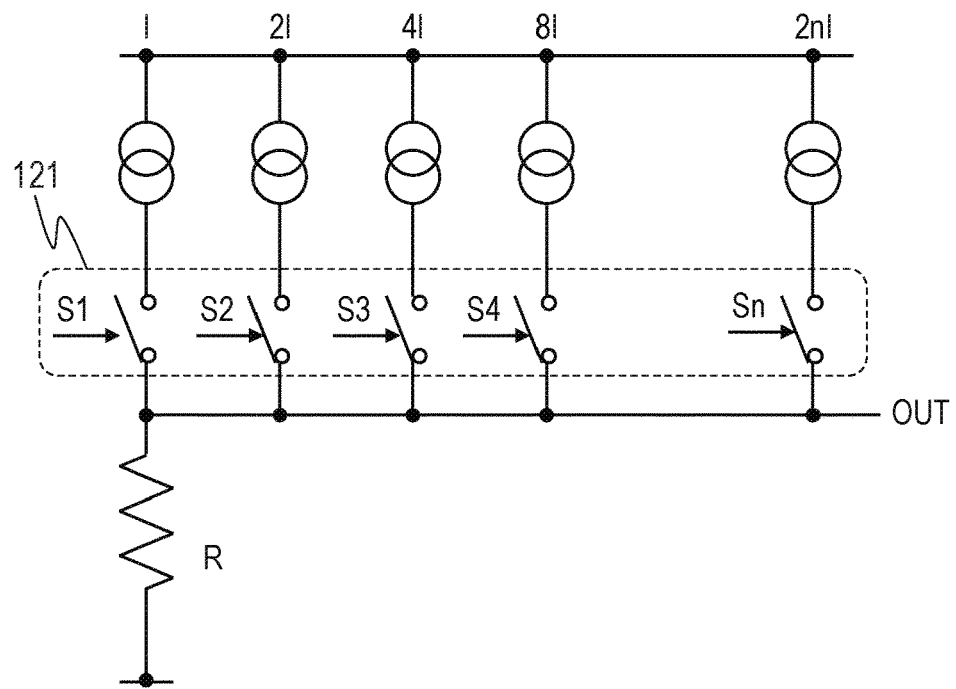
FIG. 14A is a diagram illustrating a circuit diagram of a ramp signal generator.

FIG. 14A is a circuit diagram of the ramp signal generator 11. The ramp signal generator 11 of the present embodiment is a digital-to-analog converter (DAC) that changes the output voltage thereof based on an input control signal. The ramp signal generator 11 has a current source whose current value is proportional to binary values. The ramp signal generator 11 further has a switch group 121. The switch group 121 switches the corresponding switch to be turned on and off in accordance with the signal level of signals S1 to Sn input from a control unit (not illustrated).

Figure 14B:
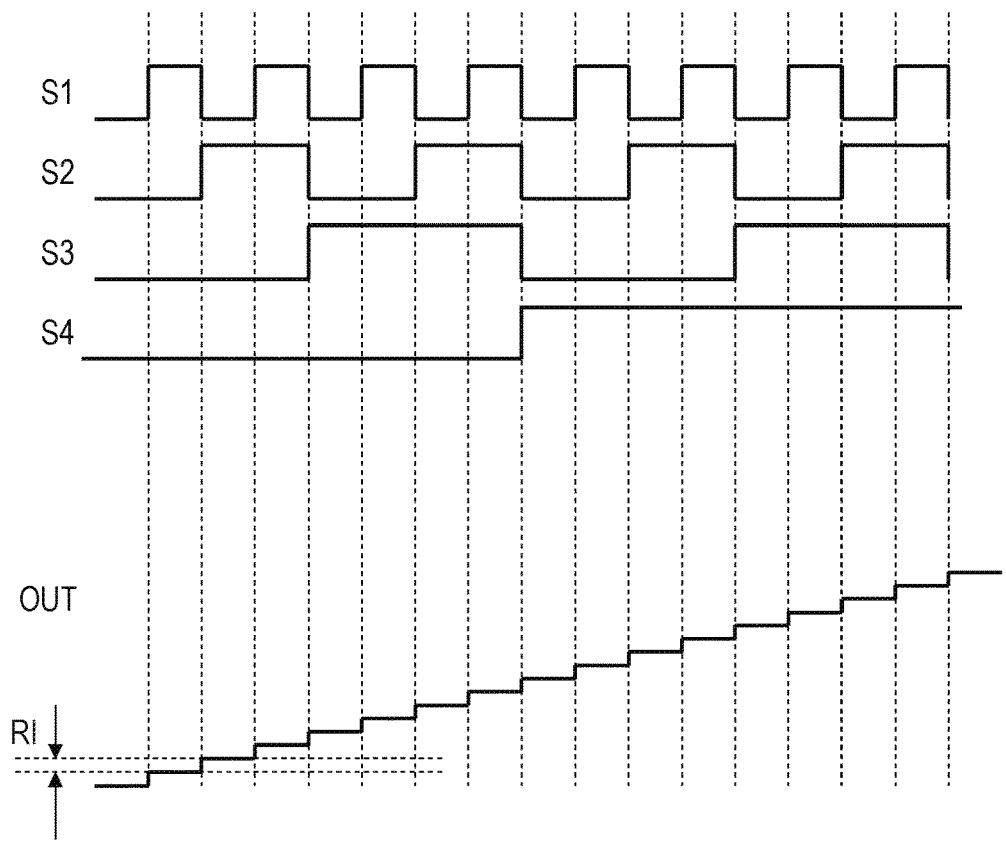
FIG. 14B is a diagram illustrating an operation of the ramp signal generator.

FIG. 14B is a diagram illustrating the signal S1 to S4 that is a part of the signals S1 to Sn and an output signal OUT (ramp signal). The potential of the output signal OUT changes stepwise in accordance with the signals S1 to S4 output from the control unit. In the present embodiment, such a signal whose potential changes stepwise can be used as the ramp signal.

Figure 15A:
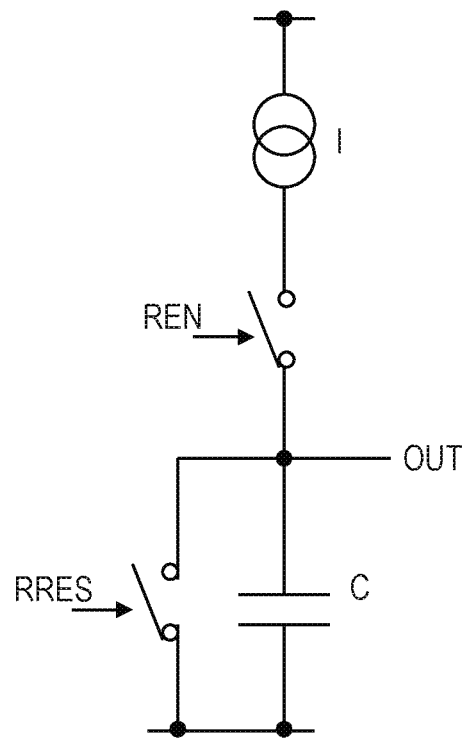
FIG. 15A is a diagram illustrating a circuit diagram of a ramp signal generator.
Figure 15B:
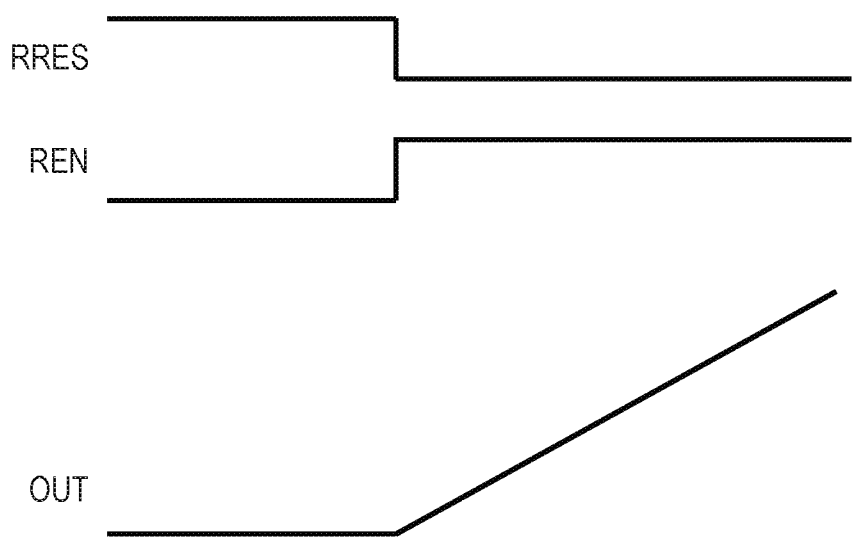
FIG. 15B is a diagram illustrating an operation of the ramp signal generator.

Note that the ramp signal generator 11 is not limited to this example of the DAC. For example, as illustrated in FIG. 15A, a current source I, a capacitor C connected to the current source I, and a switch controlled by a control signal RRES are provided as the ramp signal generator 11. The output voltage may be sequentially changed as the ramp signal by charging the capacitor C by using the current source I (FIG. 15B).

Note that frequent operations of turning on and off the switch group 121 may cause switching noise in the DAC. For example, when the pixel 12, which is an analog circuit, is located close to the DAC, the switching noise of the DAC may be superimposed on the signal generated by the pixel 12. Therefore, when the ramp signal generator 11 causing large noise, such as the DAC, is used, it is desirable to provide the ramp signal generator 11 in a chip other than the first chip 1 in which the pixel 12 is provided.

Eighth Embodiment

An imaging device of the present embodiment will be described mainly for the features different from those of the fifth embodiment.

Figure 16:
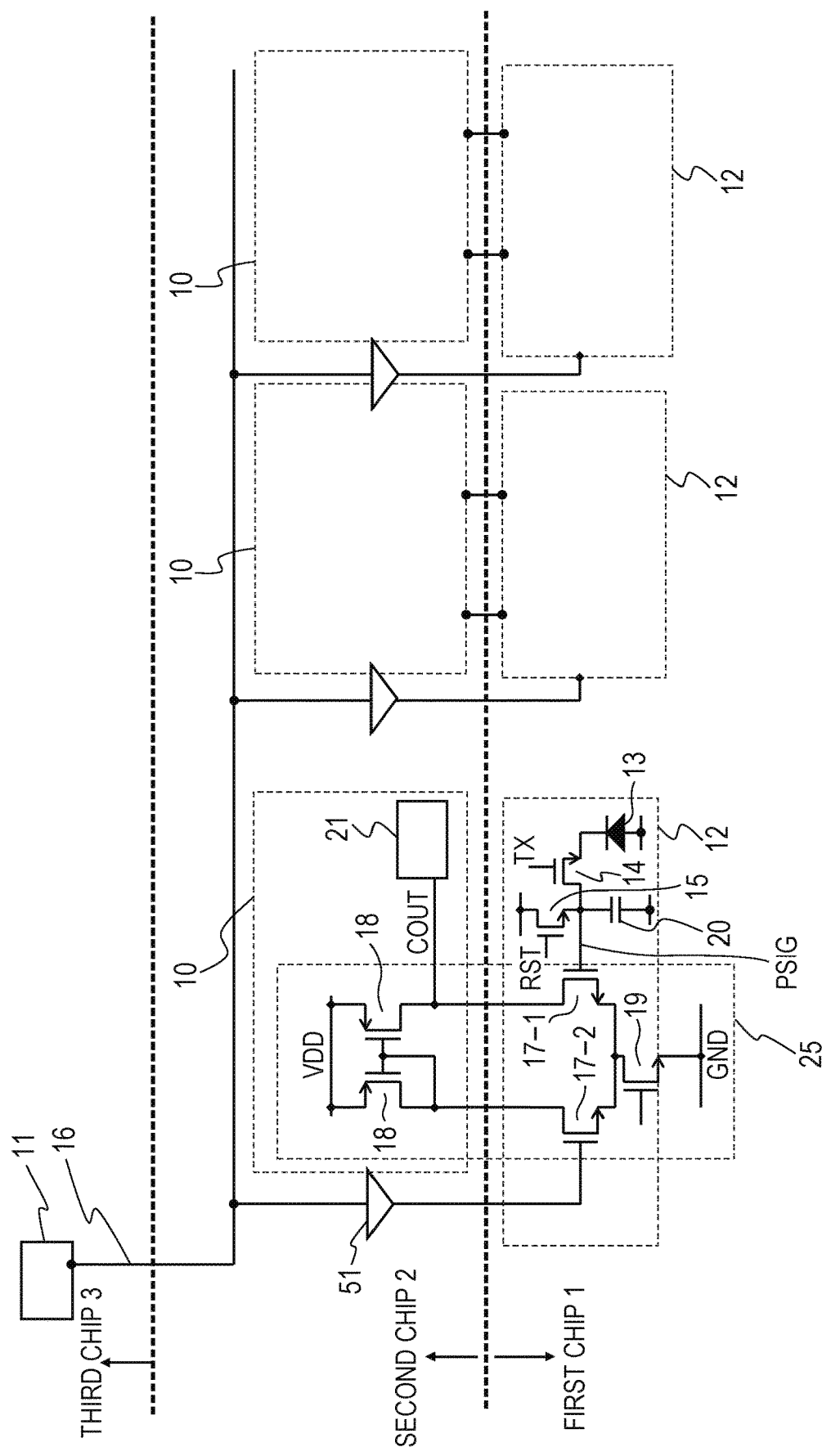
FIG. 16 is a circuit diagram of an imaging device.

In the imaging device of the fifth embodiment, the signal processing circuit 10 and the ramp signal generator 11 are provided in the same second chip 2. In the present embodiment, as illustrated in FIG. 16, the ramp signal generator 11 is provided in a third chip 3 that is different from the first chip 1 in which the pixel 12 is provided and from the second chip 2 in which the signal processing circuit 10 is provided.

According to such a configuration, the ramp signal generator 11 is provided in a chip that is different from the first chip 1 and the second chip 2, and thereby noise due to the ramp signal generator 11 can be less likely to propagate to the first chip 1 and the second chip 2.

Thereby, the imaging device of the present embodiment can suppress noise due to the ramp signal generator 11 from propagating to the pixel 12 and the signal processing circuit 10.

Ninth Embodiment

An imaging device of the present embodiment will be described mainly for the features different from those of the second embodiment.

In the present embodiment, the amount of charges accumulated by the photoelectric converter 13 is compared with a threshold. When the result of this comparison indicates that the amount of accumulated charges is greater than the threshold, a ramp signal having a relatively larger change rate (slope) of the potential is used. On the other hand, when the result of this comparison indicates that the amount of accumulated charges by the photoelectric converter 13 is less than the threshold, a ramp signal having a relatively smaller change rate (slope) of the potential is used.

Figure 17:
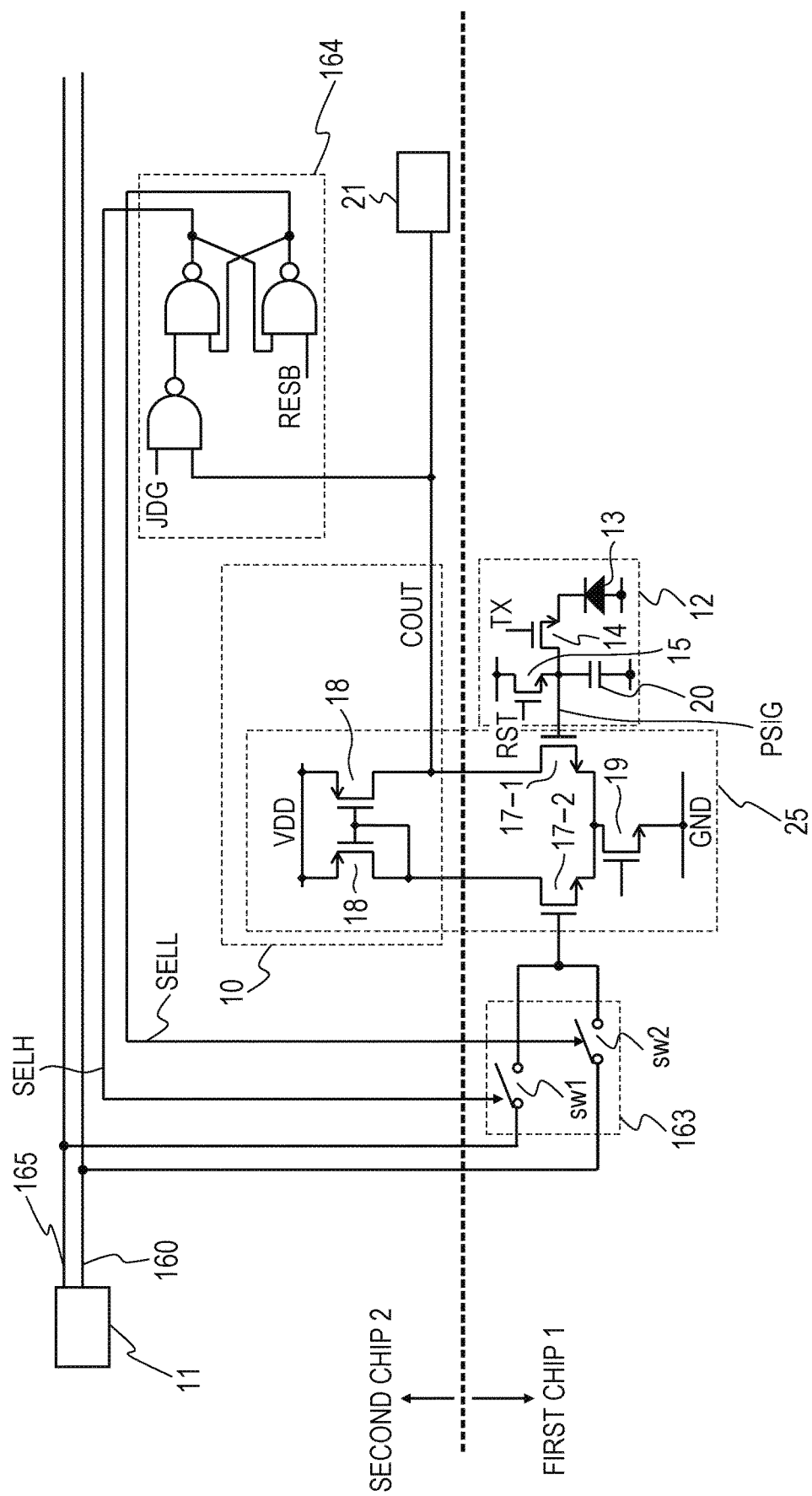
FIG. 17 is a circuit diagram of an imaging device.

FIG. 17 is a circuit diagram of the imaging device of the present embodiment. In the imaging device of the present embodiment, a plurality of transmission lines, namely, a transmission line 160 and a transmission line 165 are connected to the ramp signal generator 11. The ramp signal generator 11 outputs the ramp signal having a relatively larger slope to the transmission line 165 and outputs the ramp signal having a relatively smaller slope to the transmission line 160.

The imaging device has a selection unit 164 in the second chip 2. A signal JDG and a signal RESB are input to the selection unit 164 from the control unit (not illustrated). Further, the signal COUT from the differential stage 25 is input to the selection unit 164.

Further, the imaging device has a switching unit 163 in the first chip 1. The switching unit 163 has a switch sw1 and a switch sw2. A signal SELH is input to the switch sw1 from the selection unit 164. Further, a signal SELL is input to the switch sw2 from the selection unit 164.

Figure 18:
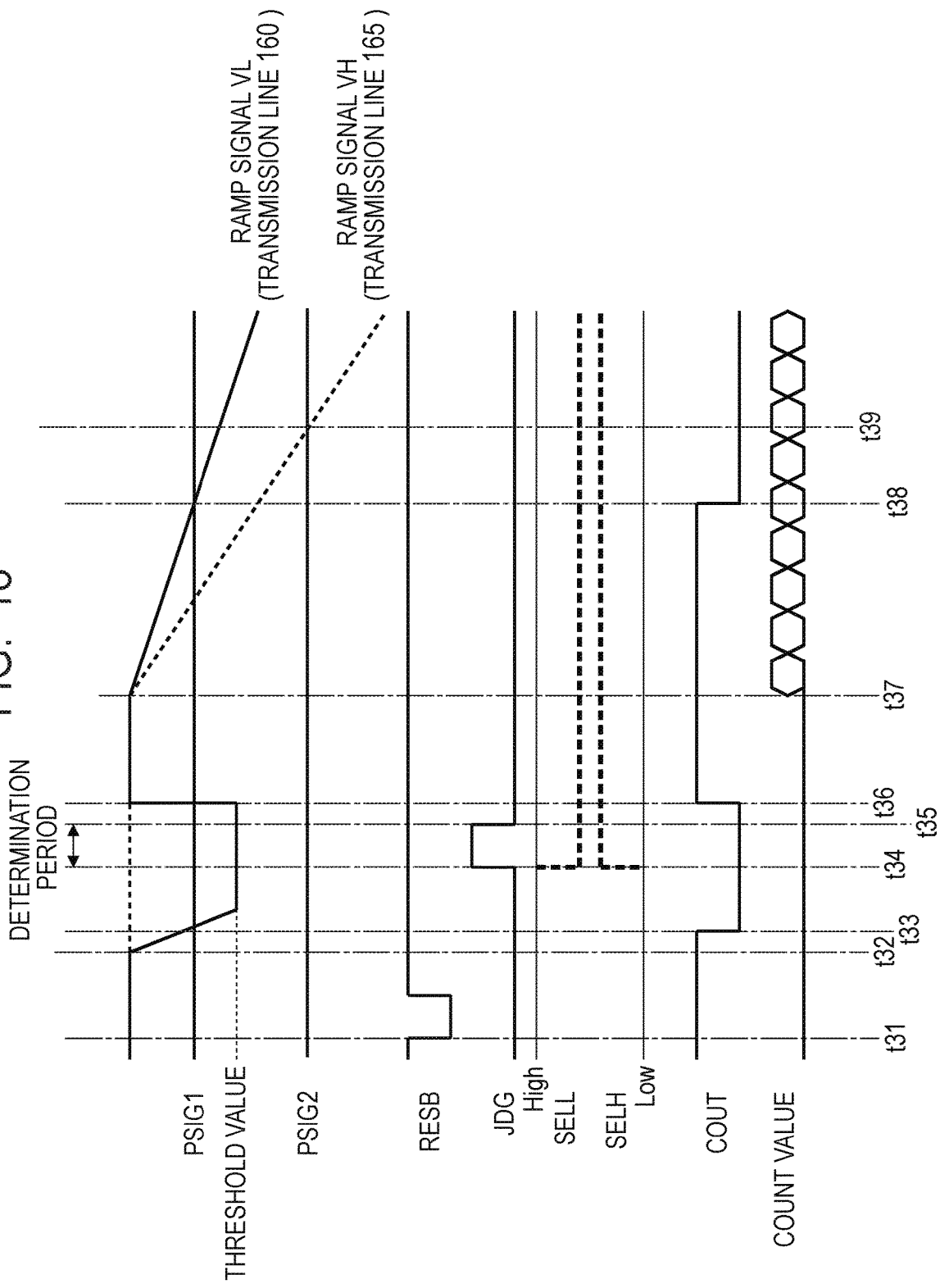
FIG. 18 is a diagram illustrating an operation of the imaging device.

FIG. 18 is a timing diagram illustrating an operation of the imaging device illustrated in FIG. 17.

In the period before time t31, noise data from time t1 to time t4 illustrated in FIG. 3 is acquired. During this period, the selection unit 164 turns on the switch sw1 and turns off the switch sw2. The ramp signal generator 11 then supplies a ramp signal to the transmission line 165, and noise data from time t1 to time t4 is acquired.

FIG. 18 illustrates two cases where the signal PSIG is a signal PSIG1 and where the signal PSIG is a signal PSIG2. The signal PSIG1 corresponds to a case where charges accumulated in the photoelectric converter 13 are less than the threshold. Further, the signal PSIG2 corresponds to a case where charges accumulated in the photoelectric converter 13 are greater than the threshold. Since charges accumulated by the photoelectric converter 13 are electrons, the value of the signal PSIG1 is a larger voltage than the threshold. The value of the signal PSIG2 is a smaller voltage than the threshold. In other words, the value of the signal PSIG1 has a smaller amplitude than the threshold. Further, the value of the signal PSIG2 has a larger amplitude of the threshold. An amplitude as used herein can be handled as a difference from a reference potential. The reference potential is typically the potential of the reset floating diffusion 20.

Before time t31, although not illustrated, the signal TX has been changed as illustrated in time t4 to time t5 of FIG. 3. In response, the floating diffusion 20 becomes the potential of the signal PSIG1 or the PSIG2. An example of the signal PSIG1 will be mainly described below, and a difference from the case of the signal PSIG1 will be described for the signal PSIG2. Note that, in FIG. 18, the case of the signal PSIG1 is depicted by solid lines, and the case of the signal PSIG2 is depicted by dashed lines.

At time t32, the ramp signal generator 11 changes the potential of the transmission line 165 to the threshold level. The signal COUT changes from the High level to the Low level.

At time t34, the control unit (not illustrated) sets the signal JDG to a High level. Thereby, the signal levels of the signal SELL and the signal SELH are determined based on the signal level of the signal COUT obtained at time t34. As a result, the selection unit 164 holds the signal level of the signal SELL to the High level and the signal level of the signal SELH to the Low level.

On the other hand, in the case of the signal PSIG2, the signal SELL changes from the High level to the Low level, and the signal SELH changes from the Low level to the High level.

Then, at time t36, the ramp signal generator 11 resets the potential of the transmission line 165 to the ramp start potential.

At time t37, the ramp signal generator 11 starts changing the potential of a ramp signal VL and a ramp signal VH. The ramp signal VL is a ramp signal output to the transmission line 160 by the ramp signal generator 11. The ramp signal VH is a ramp signal output to the transmission line 165 by the ramp signal generator 11.

At time t38, the signal level of the signal COUT changes. In response, the memory unit 21 holds the count value obtained at time t38 as S-data. In the case of the signal PSIG2, the memory unit 21 holds the count value obtained at time t39 as S-data.

As discussed above, for a signal whose amplitude is smaller than the threshold, AD conversion is performed at a high resolution. On the other hand, for a signal whose amplitude is larger than the threshold, the resolution of AD conversion is suppressed and the AD conversion is performed for a length equal to the period for a signal whose amplitude is smaller than the threshold. This can realize AD conversion which achieves both a higher speed and a higher resolution.

Figure 19:
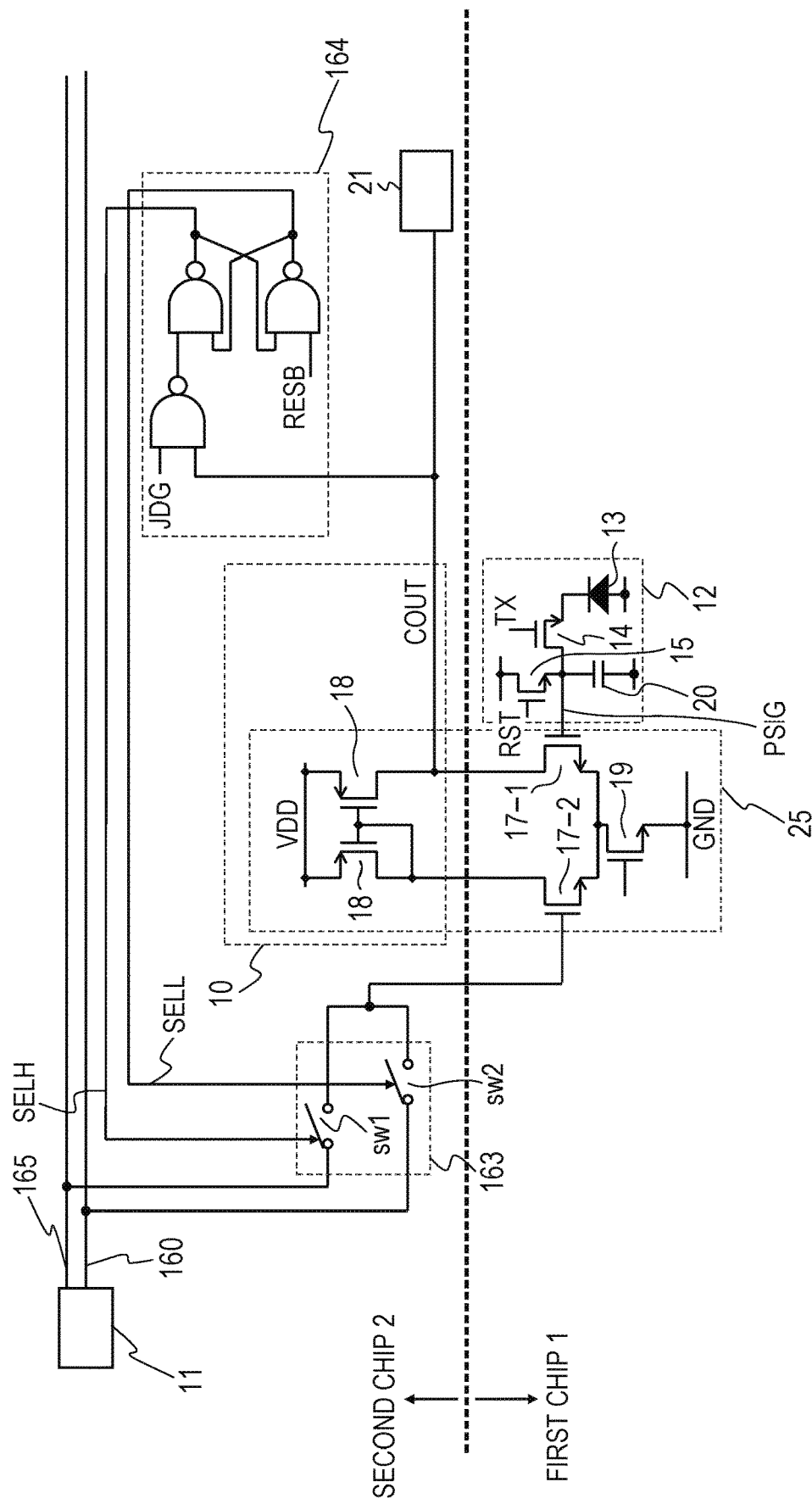
FIG. 19 is a circuit diagram of an imaging device.

Note that, in the present embodiment, the switching unit 163 is provided in the first chip 1. As another example, as illustrated in FIG. 19, the switching unit 163 may be provided in the second chip 2. In FIG. 17, four connection parts for the ramp signal VL, the ramp signal VH, the signal SELL, and the signal SELH are required to be provided between the first chip 1 and the second chip 2 in the electrical path from the transmission lines 160 and 165 to the input transistor 17-2. On the other hand, in FIG. 19, only the single connection part of the path from the switching unit 163 to the input transistor 17-2 is required. Thereby, the number of connection parts can be reduced. This can facilitate reduction in size of the pixel 12. Further, in the example of FIG. 19, the number of wirings in the first chip 1 can also be reduced compared to the example of FIG. 17. This can also facilitate reduction in size of the pixel 12.

Further, flexibility in design of the switches sw1 and sw2 can be improved. That is, it is preferable to use transistors of the same conductivity type as transistors provided in the first chip 1 for facilitating reduction in size of the pixel 12. Therefore, in the example of FIG. 17, it is preferable to use the n-channel MOS transistors for the switches sw1 and sw2. When n-channel MOS transistors are used, however, the range of the ramp signal in which an operation as a switch is ensured is narrower compared to the case of a CMOS switch. On the other hand, in the form illustrated in FIG. 19, the switching unit 163 is provided in the second chip 2. Thus, the switches sw1 and sw2 can be a CMOS switch formed of a p-channel MOS transistor and an n-channel MOS transistor. Thereby, the range that the ramp signal may take can be wider compared to the case where the switches sw1 and sw2 are formed of n-channel MOS transistors without p-channel MOS transistors.

Tenth Embodiment

The present embodiment will be described mainly for the features different from those of the first embodiment.

Figure 20:
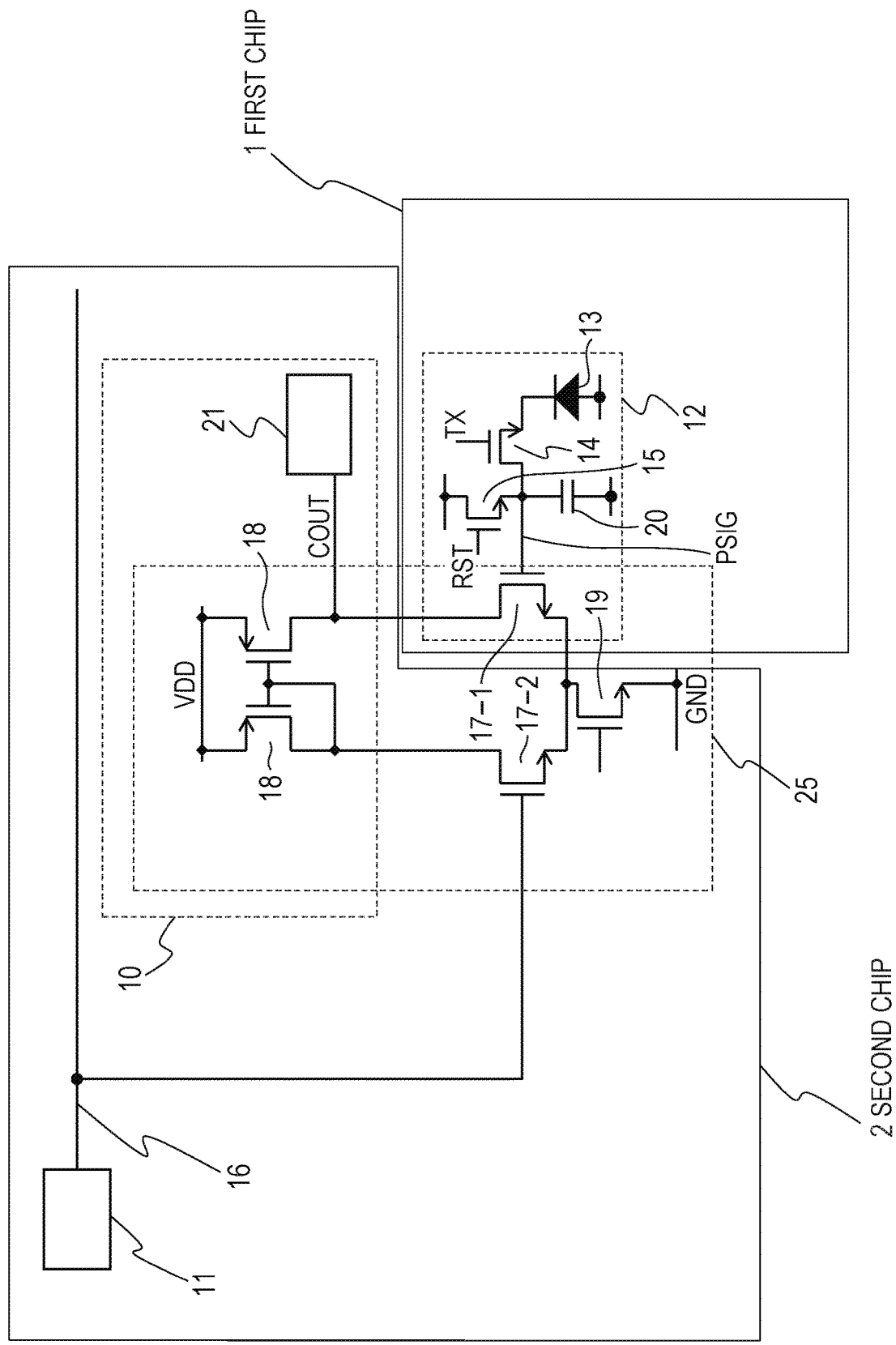
FIG. 20 is a circuit diagram of an imaging device.

FIG. 20 is a circuit diagram of an imaging device of the present embodiment. The imaging device of the present embodiment is an example in which the input transistor 17-2 and the current source 19 are provided in the second chip 2. The pixel 12 and the input transistor 17-1 are provided in the first chip 1. This example is also included in the example in which a first part of the differential stage 25 is provided in the first chip 1 and a second part of the differential stage 25 is provided in the second chip 2. Specifically, the input transistor 17-1 that is the first part of the differential stage 25 is provided in the first chip 1, and the input transistor 17-2, the current source 19, and the transistor group 18 that are the second part of the differential stage 25 are provided in the second chip 2.

The ramp signal generator 11 is provided in the second chip 2.

Also in this example, the same advantages as those of the imaging device of the first embodiment can be obtained.

Further, the connection part between the first chip 1 and the second chip 2 can be omitted in the electrical path from the ramp signal generator 11 to the input transistor 17-2. Thereby, the number of connection parts between the first chip 1 and the second chip 2 can be reduced compared to the imaging device of the first embodiment.

Eleventh Embodiment

An imaging device of the present embodiment will be described mainly for the features different from those of the second embodiment.

The circuit of the imaging device of the present embodiment can be configured as illustrated in FIG. 5.

Figure 21:
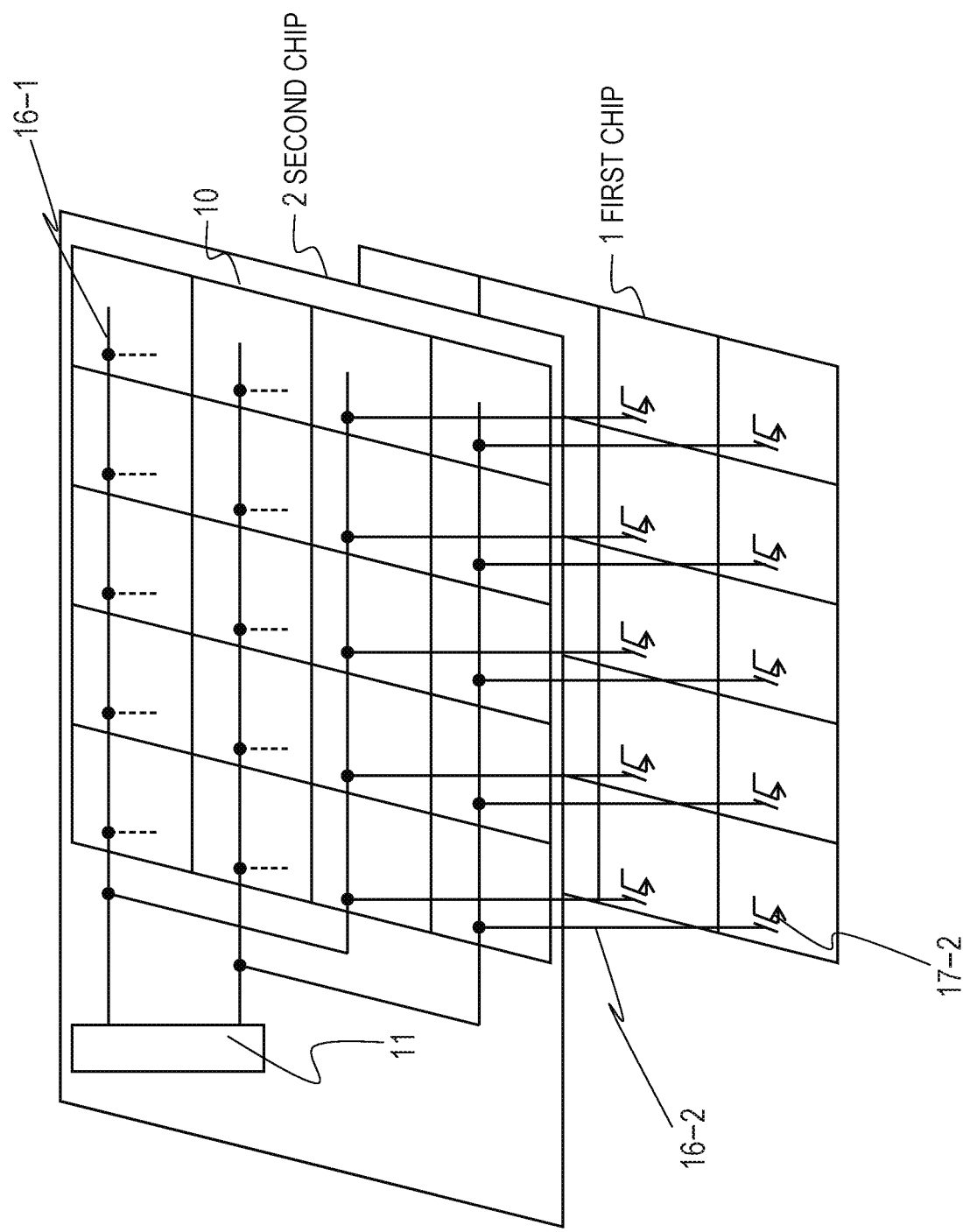
FIG. 21 is a schematic diagram of an imaging device.

FIG. 21 is a schematic diagram illustrating a layout of wirings of the imaging device of the present embodiment.

In the imaging device of the present embodiment, the transmission line 16-1 that supplies the ramp signal is divided into one for the differential stages 25 on even-numbered rows and the other for the differential stages 25 on odd-numbered rows. That is, ones of the plurality of transmission lines 16-1 are arranged to be connected to the input transistors 17-2 of the differential stages 25 on odd-numbered rows. Further, the others of the plurality of transmission lines 16-1 are arranged to be connected to the input transistors 17-1 of the differential stages 25 on even-numbered rows.

When a single transmission line 16-1 is used to supply the ramp signal to the differential stages 25 on both of even-numbered rows and odd-numbered rows, kickback noise due to a change of the signal level of the signal COUT of one differential stage 25 may propagate to another differential stage 25 through the transmission line 16-1 during an AD conversion period. Thereby, in the differential stage 25 affected by the kickback noise, the timing when the signal level of the signal COUT changes may be earlier or later than the timing supposed to be due to the kickback.

In contrast, in the imaging device of the present embodiment, the transmission line 16-1 is divided into ones used for transmitting the ramp signal on even-numbered rows and the other used for transmitting the ramp signal on odd-numbered rows. This can suppress kickback noise due to a change in the signal level of the signal COUT of one differential stage 25 from propagating to another differential stage 25 on the adjacent row. This can suppress reduction in accuracy of AD conversion caused by kickback noise. Further, when a color filter is arranged on each of the pixels 12 of the imaging device, color mixture occurs if kickback noise of the differential stage 25 associated with the pixel 12 of a color propagates to the differential stage 25 associated with the pixel 12 of another color. Therefore, the imaging device of the present embodiment further has an advantage of reduction of color mixture.

Note that, in the present embodiment, the transmission line 16-1 that transmits the ramp signal is divided into even-numbered rows and odd-numbered rows. As another example, the transmission line that transmits the ramp signal may be divided into even-numbered columns and odd-numbered columns.

Figure 22:
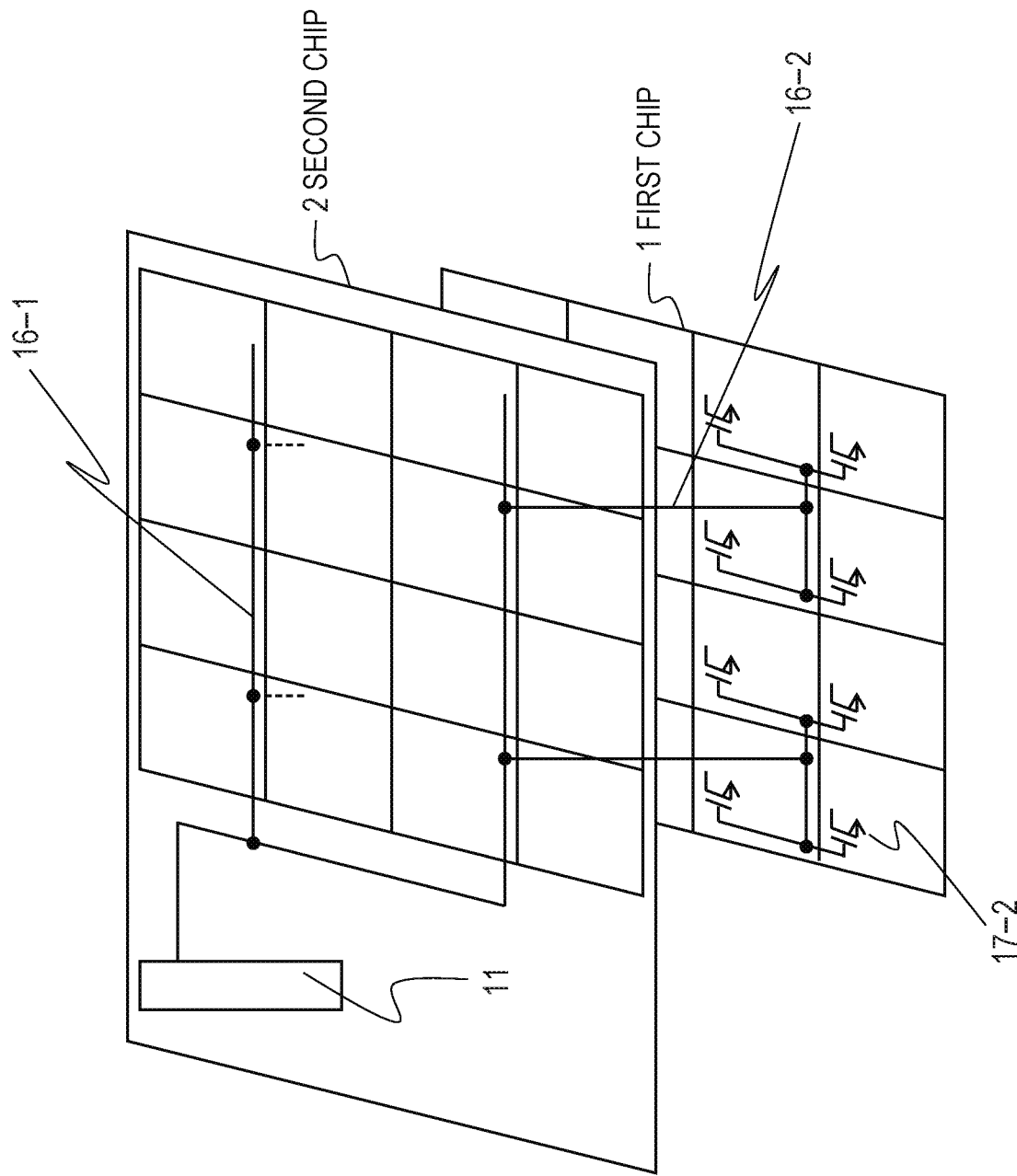
FIG. 22 is a schematic diagram of an imaging device.

Further, in the present embodiment, the example in which the input transistor 17-2 of a single differential stage 25 is connected to a single connection part has been described. The embodiment is not limited thereto, and input transistors of multiple differential stages 25 may be connected to a single connection part as illustrated in FIG. 22, for example.

Twelfth Embodiment

An imaging device of the present embodiment will be described mainly for the features different from those of the eleventh embodiment.

The circuit of the imaging device of the present embodiment can be configured as illustrated in FIG. 2.

Figure 23:
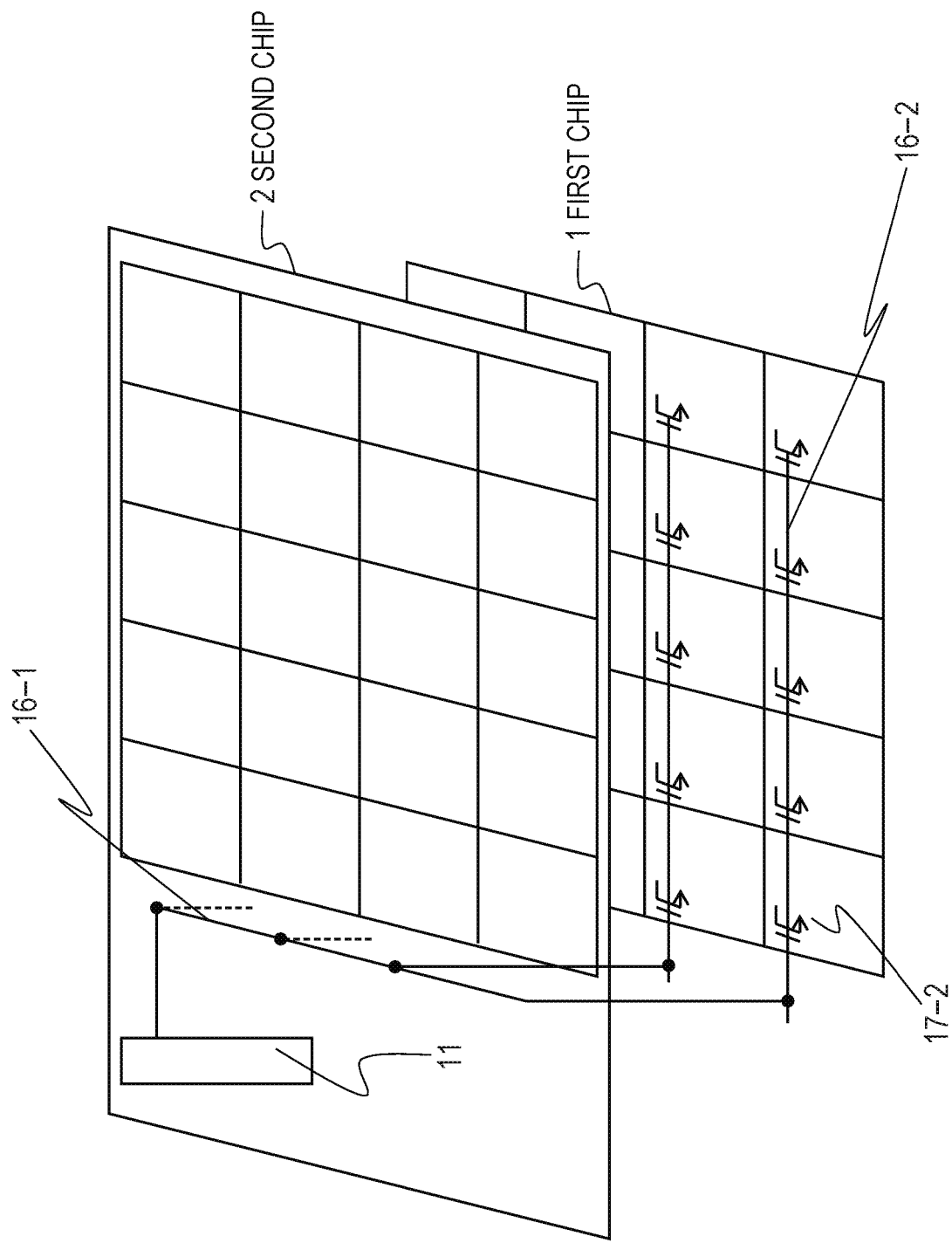
FIG. 23 is a schematic diagram of an imaging device.

FIG. 23 is a schematic diagram illustrating a layout of wirings of the imaging device of the present embodiment.

In the imaging device of the present embodiment, the input transistors 17-2 of the differential stages 25 of the pixels 12 on a plurality of columns on one row are connected to one of the transmission lines 16-2 that transmit the ramp signal in the first chip 1.

Thereby, the number of connection parts connecting the transmission line 16-1 to the transmission line 16-2 can be reduced compared to the imaging device of the eleventh embodiment. This can facilitate reduction in size of the first chip 1 and the second chip 2.

Thirteenth Embodiment

An imaging device of the present embodiment will be described mainly for the features different from those of the eleventh embodiment.

Figure 24:
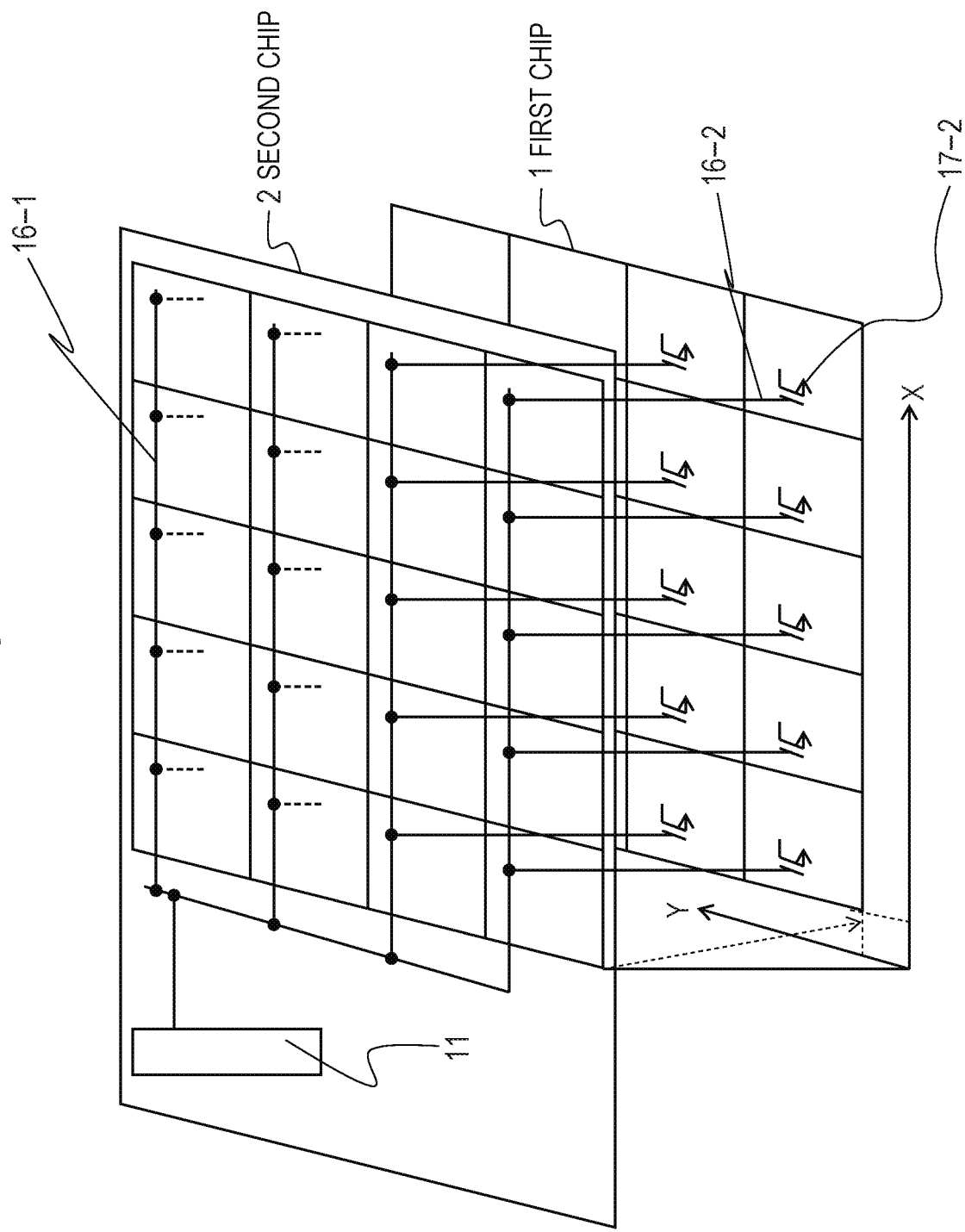
FIG. 24 is a schematic diagram of an imaging device.

FIG. 24 is a diagram illustrating a layout of wirings of the imaging device of the present embodiment.

The imaging device of the present embodiment is an example in which the center position of the pixel 12 and the center position of the signal processing circuit 10 are offset from each other in arrangement. The pitch of the pixels 12 and the pitch of the signal processing circuits 10 are the same.

The center position of the pixel 12 and the center position of the signal processing circuit 10 will be described. First of all, the outer edge of each pixel 12 can be defined by element isolation regions that electrically isolate the adjacent pixels 12 from each other, for example. The center of the region surrounded by the element isolation regions can be defined as the center of the pixel 12.

Similarly, with respect to the signal processing circuit 10, the outer edge of each signal processing circuit 10 can be defined by element isolation regions that electrically isolate the adjacent signal processing circuits 10 from each other. The center of the region surrounded by the element isolation regions can be defined as the center of the signal processing circuit 10.

Further, the center position of the pixel 12 and the center position of the signal processing circuit 10 are not overlapped with each other in a planar view. Thereby, even when the position of the input transistor 17-2 is offset from the center position of the pixel 12, the transmission line 16-1 and the transmission line 16-2 can be wired in a manner perpendicular to the first chip 1 and straight. Thereby, the wiring length between the input transistor 17-2 and the transmission line 16-1 can be reduced compared to the case where the transmission line 16-2 is bent multiple times. This can reduce delay of the ramp signal due to the wiring length.

Fourteenth Embodiment

Figure 25:
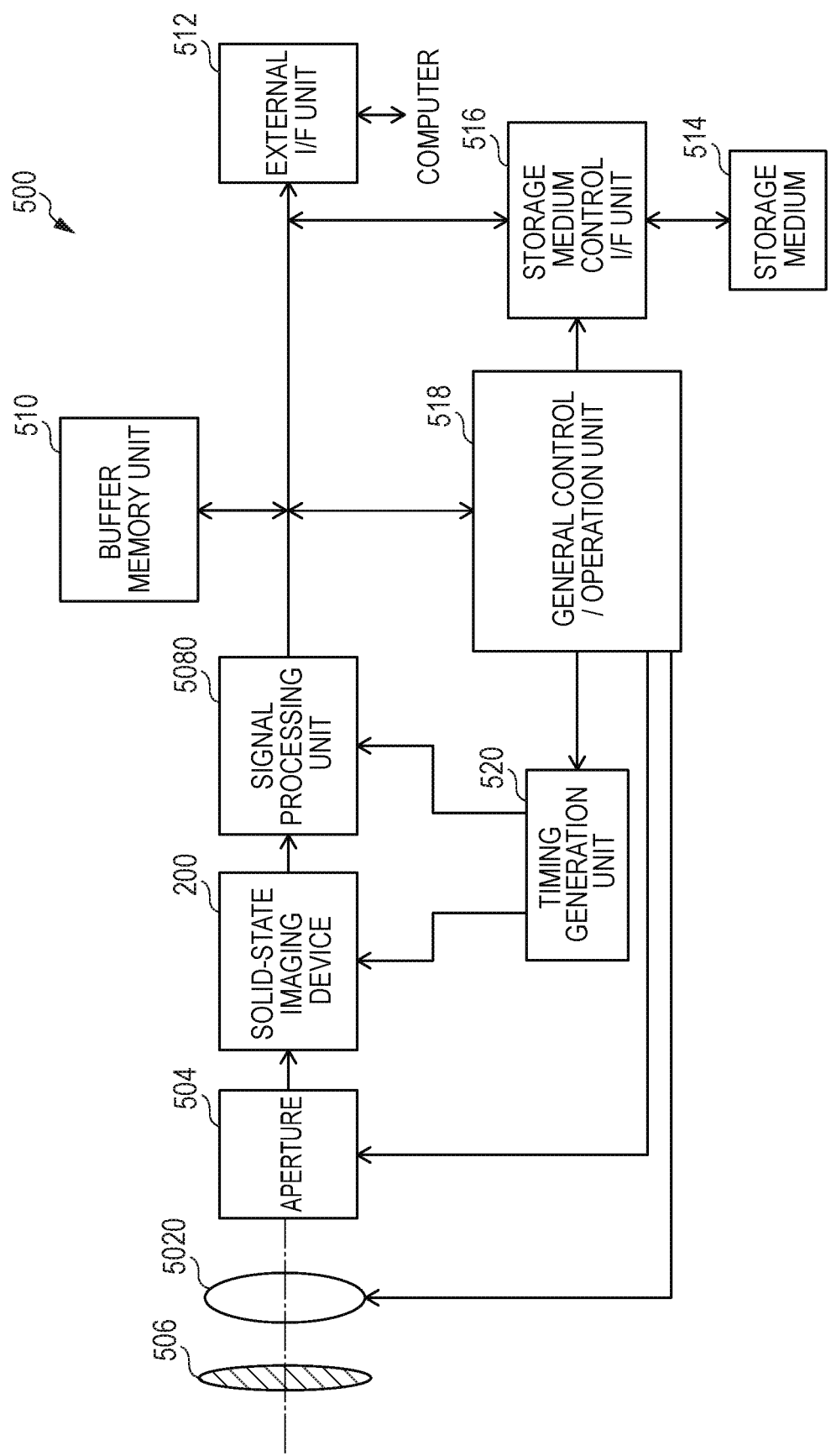
FIG. 25 is a general diagram of an imaging system.

FIG. 25 is a block diagram illustrating a configuration of an imaging system 500 according to the present embodiment. An imaging system 500 of the present embodiment includes an imaging device 200 to which the configuration of the imaging device of any of the embodiments described above is applied. A specific example of the imaging system 500 may be a digital still camera, a digital camcorder, a surveillance camera, or the like. FIG. 25 illustrates a configuration example of a digital still camera to which the imaging device of any of the embodiments described above is applied as the imaging device 200.

The imaging system 500 illustrated as an example in FIG. 25 has the imaging device 200, a lens 5020 that captures an optical image of a subject onto the imaging device 200, an aperture 504 for changing a light amount passing through the lens 5020, and a barrier 506 for protecting the lens 5020. The lens 5020 and the aperture 504 form an optical system that converges a light onto the imaging device 200.

The imaging system 500 further has a signal processing unit 5080 that processes an output signal output from the imaging device 200. The signal processing unit 5080 performs an operation of signal processing for performing various correction and compression on an input signal, if necessary, to output the signal. The signal processing unit 5080 may have a function of performing an AD conversion process on an output signal output from the imaging device 200. In this case, an AD converter circuit is not necessarily required to be included inside the imaging device 200.

The imaging system 500 further has a buffer memory unit 510 used for temporarily storing image data therein and an external interface unit (external I/F unit) 512 used for communicating with an external computer or the like. The imaging system 500 further has a storage medium 514 such as a semiconductor memory used for performing storage or readout of imaging data and a storage medium control interface unit (storage medium control I/F unit) 516 used for performing storage or readout on the storage medium 514. Note that the storage medium 514 may be embedded in the imaging system 500 or may be removable.

The imaging system 500 further has a general control/operation unit 518 that performs various computation and controls the entire digital still camera and a timing generation unit 520 that outputs various timing signals to the imaging device 200 and the signal processing unit 5080. The timing signal or the like may be externally input, and the imaging system 500 may have at least the imaging device 200 and the signal processing unit 5080 that processes an output signal output from the imaging device 200. The general control/operation unit 518 and the timing generation unit 520 may be configured to perform some or all of the control functions of the imaging device 200.

The imaging device 200 outputs an image signal to the signal processing unit 5080. The signal processing unit 5080 performs predetermined signal processing on an imaging signal output from the imaging device 200 and outputs image data. Further, the signal processing unit 5080 generates an image by using the imaging signals.

By forming an imaging system using the imaging device of each of the embodiments described above, it is possible to realize an imaging system that can acquire a higher quality image.

Fifteenth Embodiment

Figure 26A:
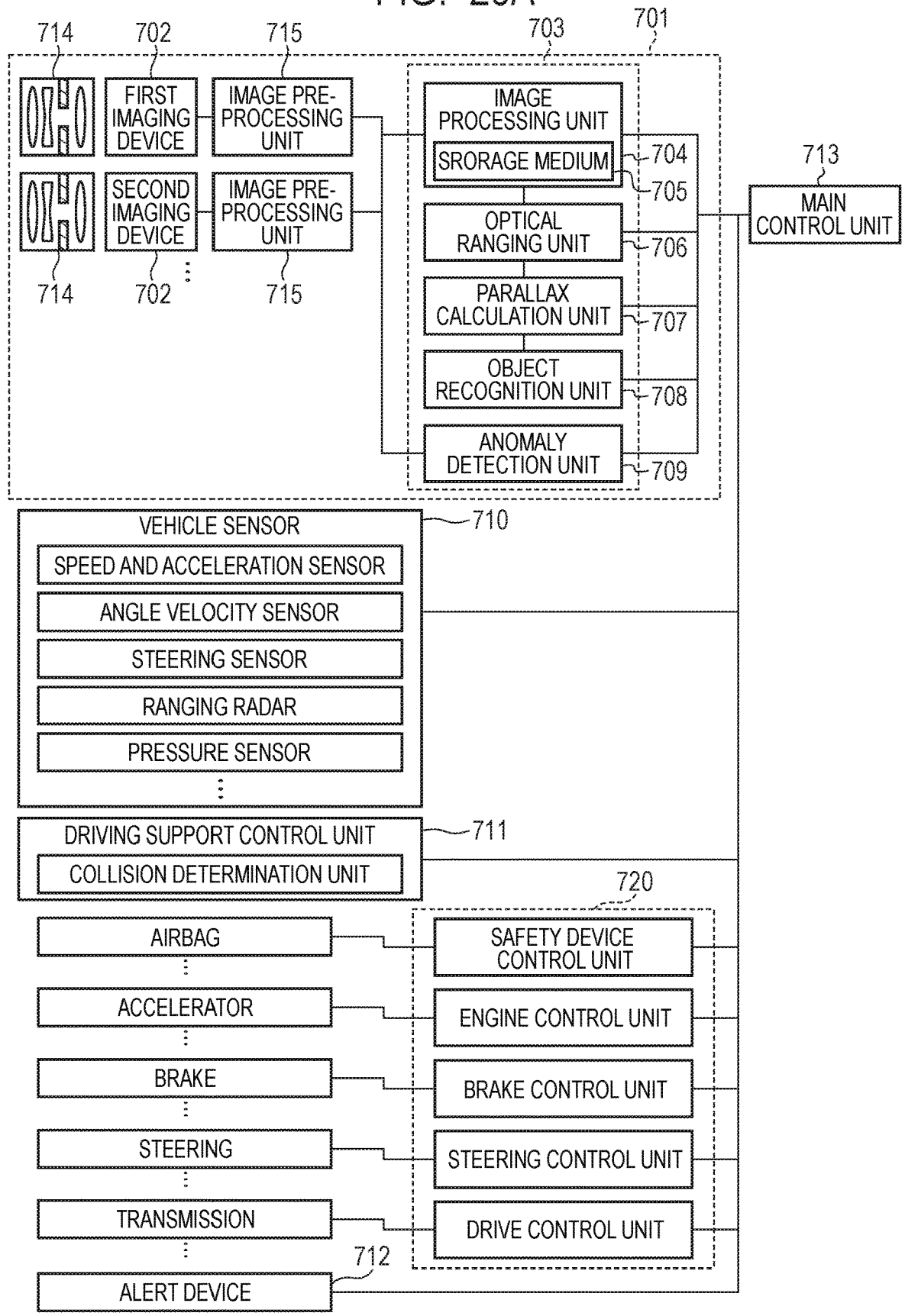
FIG. 26A is a general diagram of an imaging system.
Figure 26B:
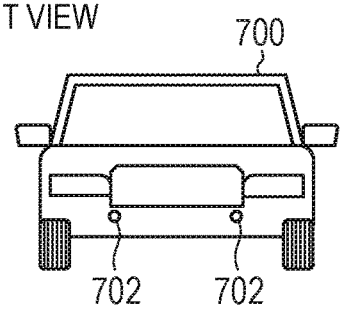
FIG. 26B, FIG. 26C, and FIG. 26D are general diagrams of a movable object.
Figure 26C:
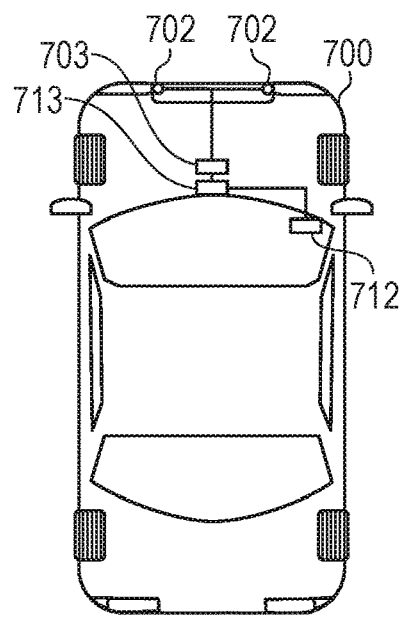
Figure 26D:
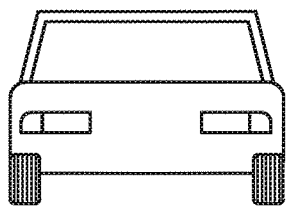
Figure 27:
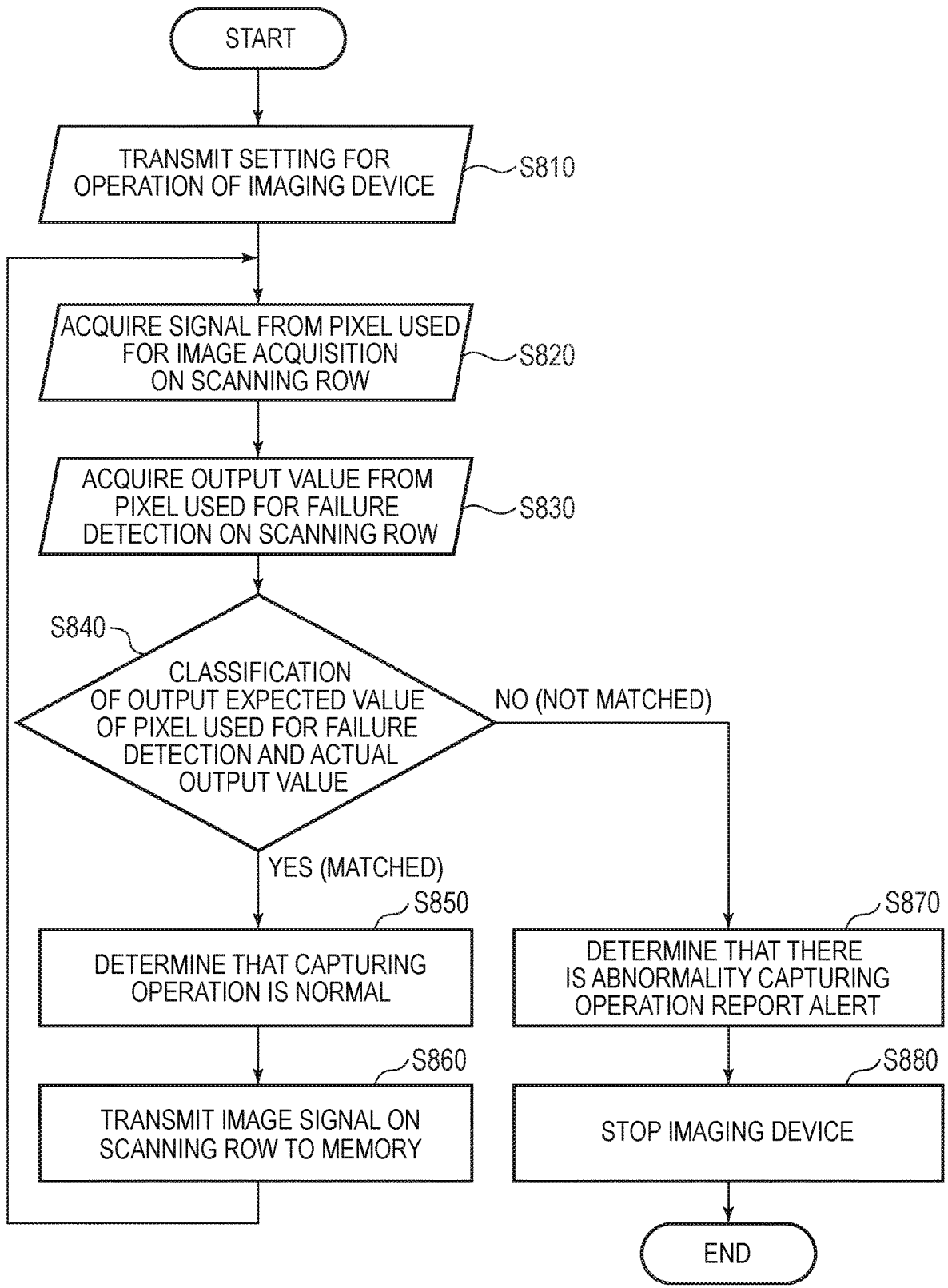
FIG. 27 is a diagram illustrating a signal processing flow of the imaging system.

An imaging system and a movable object of the present embodiment will be described by using FIG. 26A to FIG. 27. FIG. 26A is a general diagram illustrating a configuration example of the imaging system according to the present embodiment. FIG. 26B to FIG. 26D are general diagrams illustrating a configuration example of the movable object according to the present embodiment. FIG. 27 is a flow diagram illustrating an operation of the imaging system according to the present embodiment.

In the present embodiment, an example of an imaging system related to an on-vehicle camera will be illustrated. FIG. 26A to FIG. 26D illustrate an example of a vehicle system and an imaging system mounted thereon. An imaging system 701 has imaging devices 702, image preprocessing units 715, an integrated circuit 703, and optical systems 714. Each of the optical systems 714 captures an optical image of a subject on the imaging device 702. Each of the imaging devices 702 converts an optical image of a subject captured by the optical system 714 into an electrical signal. Each of the imaging devices 702 is the imaging device of any of the embodiments described above. Each of the image preprocessing units 715 performs predetermined signal processing on a signal output from the imaging device 702. The function of the image preprocessing unit 715 may be embedded in the imaging device 702. The imaging system 701 is provided with at least two sets of the optical system 714, the imaging device 702, and the image preprocessing unit 715, and outputs from the image preprocessing units 715 of respective sets are input to the integrated circuit 703.

The integrated circuit 703 is an application specific integrated circuit for the imaging system and includes an image processing unit 704 including a memory 705, an optical ranging unit 706, a parallax calculation unit 707, an object recognition unit 708, and an anomaly detection unit 709. The image processing unit 704 performs image processing such as development process, defection correction, or the like on the output signal from the image preprocessing unit 715. The memory 705 stores primary storage of a captured image or a defection position of a captured image. The optical ranging unit 706 performs focusing or ranging of a subject. The parallax calculation unit 707 calculates a parallax (a phase difference of parallax images) from a plurality of image data acquired by the plurality of imaging devices 702. The object recognition unit 708 recognizes a subject such as an automobile, a road, a traffic sign, a person, or the like. In response to detection of an anomaly of the imaging device 702, the anomaly detection unit 709 reports the anomaly to a main control unit 713.

The integrated circuit 703 may be implemented by dedicatedly designed hardware, may be implemented by a software module, or may be implemented by the combination thereof. Further, the integrated circuit 703 may be implemented by a Field Programmable Gate Array (FPGA), an Application Specific Integrated Circuit (ASIC), or the like, or may be implemented by the combination thereof.

The main control unit 713 organizes and controls the operation of the imaging system 701, a vehicle sensor 710, a control unit 720, or the like. Note that, as a possible scheme, the imaging system 701, the vehicle sensor 710, and the control unit 720 may have separate communication interfaces without the main control unit 713 and transmit and receive control signals respectively via the communication network (for example, CAN specification).

The integrated circuit 703 has a function of transmitting a control signal or a setting value to the imaging device 702 in response to receiving the control signal from the main control unit 713 or by using a control unit of the integrated circuit 703. For example, the integrated circuit 703 transmits a setting for pulse-driving the voltage switch 13 in the imaging device 702, a setting for switching the voltage switches 13 on a frame basis, or the like.

The imaging system 701 is connected to the vehicle sensor 710 and can sense a traveling state of the vehicle, such as a vehicle speed, a yaw rate, a steering angle, or the like, and a state of an environment outside the vehicle or another vehicle and an obstacle. The vehicle sensor 710 also serves as a distance information acquisition unit that acquires information on the distance from the parallax image to the object. Further, the imaging system 701 is connected to a drive support control unit 711 that performs various drive supports such as automatic steering, automatic patrol, collision prevention function, or the like. In particular, with respect to the collision determination function, collision estimation and a collision against another vehicle and an obstacle is determined based on the sensing result of the imaging system 701 or the vehicle sensor 710. Thereby, avoidance control when a collision is estimated or startup of a safety device at a collision is performed.

Further, the imaging system 701 is connected to an alert device 712 that issues an alert to a driver based on the determination result in a collision determination unit. For example, when the determination result of the collision determination unit indicates a high possibility of collision, the main control unit 713 performs vehicle control to avoid a collision or reduce damage by applying a break, moving back the accelerator pedal, suppressing the engine power, or the like. The alert device 712 performs an alert to a user by sounding an alert such as a sound, displaying alert information on a display unit such as a car navigation system, a meter panel, or the like, providing a vibration to a sheet belt or a steering wheel, or the like.

In the present embodiment, the surrounding area of the vehicle, for example, the area in front or rear is captured by the imaging system 701. FIG. 26B to FIG. 26D illustrate an example arrangement of an imaging system 701 when the area in front of the vehicle is captured by the imaging system 701.

The two imaging devices 702 are arranged in the front of the vehicle 700. Specifically, in terms of acquisition of the distance information or determination of the possibility of collision between the vehicle 700 and the captured object, it is preferable to define the center line with respect to the traveling direction or the external shape (for example, the vehicle width) of the vehicle 700 as a symmetry axis and arrange the two imaging devices 702 in a symmetrical manner with respect to the symmetry axis. Further, it is preferable to arrange the imaging devices 702 so as not to block the driver's field of view when the driver views the surroundings outside the vehicle 700 out of the driver seat. It is preferable to arrange the alert device 712 so as to be easily viewed by the driver.

Next, a failure detection operation of the imaging device 702 in the imaging system 701 will be described by using FIG. 27. The failure detection operation of the imaging device 702 is implemented in accordance with steps S810 to S880 illustrated in FIG. 27.

Step S810 is a step of performing setting for the time of startup of the imaging device 702. That is, a setting for operation of the imaging device 702 is transmitted from the outside of the imaging system 701 (for example, the main control unit 713) or the inside of the imaging system 701 to start a capturing operation and a failure detection operation performed by the imaging device 702.

Next, in step S820, a pixel signal is acquired from an effective pixel. Further, in step S830, an output value from a failure detecting pixel provided for failure detection is acquired. This failure detecting pixel has a photoelectric converter as with the effective pixel. A predetermined voltage is written to this photoelectric converter. The failure detecting pixel outputs a signal corresponding to the voltage written to the photoelectric converter. Note that the order of step S820 and step S830 may be opposite.

Next, in step S840, classification determination of the expected output value of the failure detecting pixel and the actual output value of the failure detecting pixel is performed.

As a result of the classification determination in step S840, when the expected output value and the actual output value are matched, the process proceeds to step S850 to determine that a capturing operation is normally performed, and proceeds to step S860. In step S860, pixel signals of a scanned row are transmitted to the memory 705 and temporarily stored. The process then returns to step S820 to continue the failure detection operation.

On the other hand, as a result of the classification determination in step S840, when the expected output value and the actual output value are not matched, the process proceeds to step S870. In step S870, it is determined that there is an anomaly in a capturing operation, and an alert is reported to the main control unit 713 or the alert device 712. The alert device 712 causes a display unit to display that an anomaly is detected. In step S880, the operation of the imaging device 702 is then stopped, and the operation of the imaging system 701 ends.

Note that, while an example in which the flowchart is looped on a row basis has been illustrated as an example in the present embodiment, the flowchart may be looped on a multiple-row basis, or a failure detection operation may be performed on a frame basis.

Note that reporting of an alert in step S870 may be notified outside the vehicle via a wireless network.

Further, although an example of control for avoiding a collision to another vehicle has been described in the present embodiment, it is applicable to automatic driving control for following another vehicle, automatic driving control for not going out of a traffic lane, or the like. Furthermore, the imaging system 701 is not limited to a vehicle such as the subject vehicle and can be applied to a movable object (moving apparatus) such as a ship, an airplane, or an industrial robot, for example. In addition, the imaging system can be widely applied to a device which utilizes object recognition, such as an intelligent transportation system (ITS), without being limited to movable objects.

Modified Embodiments

The disclosure is not limited to the embodiments described above, and various modifications are possible.

For example, an example in which a part of the configuration of any of the embodiments is added to another embodiment or an example in which a part of the configuration of any of the embodiments is replaced with a part of the configuration of another embodiment is one of the embodiments.

Further, each of the embodiments described above merely illustrates an embodied example in implementing the disclosure, and the technical scope of the disclosure is not to be construed in a limiting sense by these embodiments. That is, the disclosure can be implemented in various forms without departing from the technical concept thereof or the primary features thereof.

For example, as a configuration in which a buffer circuit that relays the ramp signal is further provided, one or more of the embodiments of FIG. 7, FIG. 9, and FIG. 11 may be combined to the embodiment of FIG. 20.

According to the disclosure, it is possible to provide preferable arrangement of a ramp signal generator when a first part of the differential stage of the AD converter unit is provided in the first chip and a second part of the differential stage is provided in the second chip.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2018-022404, filed Feb. 9, 2018, which is hereby incorporated by reference herein in its entirety.

What is claimed is:

1. An imaging device comprising:
a photoelectric converter;
an analog-to-digital converter including a differential stage;
a ramp signal generator; and
a plurality of buffer circuits connected to the ramp signal generator and configured to transmit a ramp signal generated by the ramp signal generator,
wherein the photoelectric converter and a first part of the differential stage including a transistor to which a ramp signal output from the ramp signal generator is input are arranged in a first chip,
wherein a second part of the differential stage is arranged in a second chip that is a different chip from the first chip and stacked on the first chip, wherein the ramp signal generator is arranged in a different chip from the first chip, and
wherein the plurality of buffer circuits is arranged in a different chip from the first chip.

2. The imaging device according to claim 1,
wherein the differential stage has a plurality of input nodes, and
wherein a first input node of the plurality of input nodes is connected to the photoelectric converter, and a second input node of the plurality of input nodes is connected to the ramp signal generator.

3. The imaging device according to claim 2 further comprising a floating diffusion and a transfer transistor connecting the photoelectric converter to the floating diffusion,
wherein the first input node is a control node of an input transistor, and wherein the floating diffusion is connected to the control node of the input transistor.

4. The imaging device according to claim 3 further comprising a plurality of sets, each of the plurality of sets having the photoelectric converter, the floating diffusion, the transfer transistor, and the input transistor,
wherein the input transistor of each of the plurality of sets forms a differential stage with a second input transistor that is the second input node.

5. The imaging device according to claim 2,
wherein the second input node is a control node of a second input transistor, and
wherein the control node of the second input transistor is connected to the ramp signal generator.

6. The imaging device according to claim 5
wherein the differential stage is one of a plurality of differential stages,
wherein the second input node of each of the plurality of differential stages is connected to the ramp signal generator via a transmission line, and
wherein the plurality of buffer circuits and the second input node are arranged in the transmission line.

7. The imaging device according to claim 6 further comprising a plurality of connection parts, each of the plurality of connecting parts connecting the first chip and the second chip to each other,
wherein the plurality of differential stages are arranged over a plurality of rows and a plurality of columns,
wherein the transmission line includes a plurality of first transmission lines arranged in the first chip and a second transmission line arranged in the second chip,
wherein the second transmission line is connected to the plurality of connection parts, and
wherein each of the plurality of connection parts is connected to at least one of the second input nodes of the plurality of differential stages via one of the plurality of first transmission lines.

8. The imaging device according to claim 7, wherein one of the plurality of first transmission lines and the second input node(s) of some of the plurality of differential stages are connected to one of the plurality of connection parts.

9. The imaging device according to claim 8, wherein the some of the plurality of differential stages is one of the plurality of differential stages.

10. The imaging device according to claim 6 further comprising a plurality of connection parts, each of the plurality of connecting parts connecting the first chip and the second chip to each other,
wherein the plurality of differential stages are arranged over a plurality of rows and a plurality of columns,
wherein the transmission line includes a first transmission line arranged in the first chip and a second transmission line arranged in the second chip,
wherein the second transmission line is connected to the plurality of connection parts,
wherein each of the plurality of connection parts is connected to the second input node of each of the differential stages via the first transmission line, and
wherein each of the plurality of buffer circuits is arranged to correspond to one of the plurality of connection parts.

11. The imaging device according to claim 10, wherein the plurality of buffer circuits are connected in parallel to the ramp signal generator.

12. The imaging device according to claim 1,
wherein the differential stage has a plurality of input nodes and a current mirror circuit connected to the plurality of input nodes,
wherein a first input node of the plurality of input nodes is connected to the photoelectric converter, and a second input node of the plurality of input nodes is connected to the ramp signal generator, and wherein the current mirror circuit is arranged in the second chip, and the first input node is arranged in the first chip.

13. The imaging device according to claim 12, wherein the second input node is arranged in the first chip.

14. The imaging device according to claim 12,
wherein the differential stage has a current source connected to the current mirror circuit, and
wherein the current source is arranged in the first chip.

15. The imaging device according to claim 1, wherein the ramp signal is supplied to the transistor via a connection part, the connecting part connecting the first chip and the different chip and formed of a metal material.

16. The imaging device according to claim 1, wherein the plurality of buffer circuits is connected in series.

17. The imaging device according to claim 16 further comprising a plurality of connection parts, each of the plurality of connection parts connecting the first chip and the different chip in which the plurality of buffer circuits is arranged,
wherein a number of buffer circuits of the plurality of buffer circuits provided in an electrical path between one of the plurality of connection parts and the ramp signal generator differs from a number of buffer circuits of the plurality of buffer circuits provided in an electrical path between another one of the plurality of connection parts and the ramp signal generator.

18. The imaging device according to claim 1, wherein the plurality of buffer circuits is connected in parallel.

19. The imaging device according to claim 18 further comprising a plurality of connection parts, each of the plurality of connecting parts connecting the first chip and the different chip in which the plurality of buffer circuits is arranged,
wherein a number of buffer circuits of the plurality of buffer circuits provided in an electrical path between one of the plurality of connection parts and the ramp signal generator is the same as a number of buffer circuits of the plurality of buffer circuits provided in an electrical path between another one of the plurality of connection parts and the ramp signal generator.

20. An imaging system comprising:
the imaging device according to claim 1; and
a signal processing unit that processes a signal output by the imaging device.

21. A movable object comprising:
the imaging device according to claim 1; and
a control unit that controls motion of the movable object.

* * * * *